(12) United States Patent
Han

(10) Patent No.: US 12,112,799 B2
(45) Date of Patent: Oct. 8, 2024

(54) STORAGE DEVICE AND METHOD OF OPERATING THE STORAGE DEVICE

(71) Applicant: SK hynix Inc., Icheon-si (KR)

(72) Inventor: Yong Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 226 days.

(21) Appl. No.: 17/187,526

(22) Filed: Feb. 26, 2021

(65) Prior Publication Data

US 2022/0036944 A1    Feb. 3, 2022

(30) Foreign Application Priority Data

Aug. 3, 2020  (KR) .................. 10-2020-0097006
Jan. 11, 2021 (KR) .................. 10-2021-0003589

(51) Int. Cl.
  *G11C 11/56*   (2006.01)
  *G11C 16/04*   (2006.01)
  *G11C 16/10*   (2006.01)
  *G11C 16/26*   (2006.01)
  *G11C 16/34*   (2006.01)

(52) U.S. Cl.
  CPC ...... *G11C 11/5628* (2013.01); *G11C 11/5642* (2013.01); *G11C 11/5671* (2013.01); *G11C 16/0483* (2013.01); *G11C 16/10* (2013.01); *G11C 16/26* (2013.01); *G11C 16/3459* (2013.01); *G11C 2216/14* (2013.01)

(58) Field of Classification Search
  CPC . G11C 11/5628; G11C 16/10; G11C 2216/14; G11C 16/12; G11C 2211/5648; G11C 11/5642; G11C 16/26; G11C 16/3459; G11C 16/32; G11C 16/3427; G11C 16/34
  See application file for complete search history.

(56) References Cited

U.S. PATENT DOCUMENTS

2009/0040836 A1* 2/2009 Lee ................... G11C 16/0483
                                                365/185.12
2010/0254188 A1* 10/2010 Ohsuk ................ G11C 11/5628
                                                365/185.18

(Continued)

FOREIGN PATENT DOCUMENTS

KR    1020180035492 A    4/2018
KR      101927212 B1     3/2019

*Primary Examiner* — Uyen Smet
(74) *Attorney, Agent, or Firm* — WILLIAM PARK & ASSOCIATES LTD.

(57) ABSTRACT

An electronic device includes memory devices, and a memory controller configured to provide program commands instructing to store data in the memory devices, each of the memory devices including a memory block including a plurality of memory cells, a peripheral circuit configured to perform a first program operation and a second program operation of storing the data in select memory cells which are memory cells selected from among the plurality of memory cells, in response to the program command, and a program operation controller configured to control the first program operation and the second program operation, the first program operation performed using one logical page data among page data to be stored in the select memory cells, and the second program operation performed using remaining logical page data except for the one logical page data among the page data.

21 Claims, 25 Drawing Sheets

(56) References Cited

U.S. PATENT DOCUMENTS

| | | | |
|---|---|---|---|
| 2011/0051510 A1* | 3/2011 | Honma | G11C 16/3459 365/185.21 |
| 2017/0177265 A1* | 6/2017 | Srinivasan | G06F 3/0604 |
| 2018/0090217 A1* | 3/2018 | Park | G11C 16/0483 |
| 2018/0261291 A1* | 9/2018 | Nagao | H10B 43/27 |
| 2018/0294031 A1* | 10/2018 | Seo | G11C 16/10 |

* cited by examiner

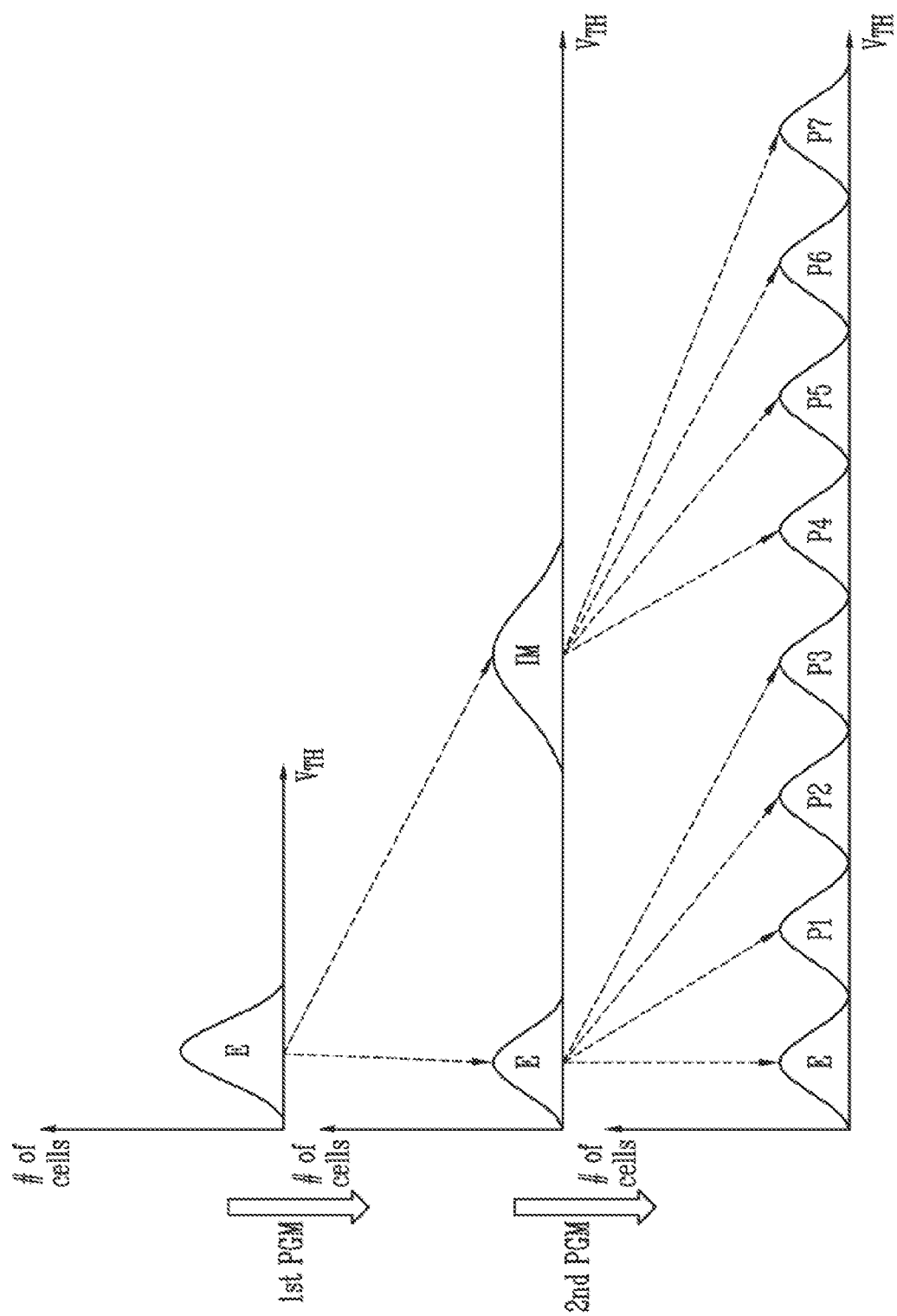

FIG. 9A

PROGRAM ORDER

| Physical WL | Logical WL | Page | 1st PGM | 2nd PGM |
|---|---|---|---|---|
| WL1 | LWL1 | PG1 | 1 | 9 |
|  | LWL2 | PG2 | 2 | 10 |
|  | LWL3 | PG3 | 3 | 11 |
|  | LWL4 | PG4 | 4 | 12 |
| WL2 | LWL1 | PG5 | 5 | 17 |
|  | LWL2 | PG6 | 6 | 18 |
|  | LWL3 | PG7 | 7 | 19 |
|  | LWL4 | PG8 | 8 | 20 |
| WL3 | LWL1 | PG9 | 13 | 25 |
|  | LWL2 | PG10 | 14 | 26 |
|  | LWL3 | PG11 | 15 | 27 |
|  | LWL4 | PG12 | 16 | 28 |
| WL4 | LWL1 | PG13 | 21 | 33 |
|  | LWL2 | PG14 | 22 | 34 |
|  | LWL3 | PG15 | 23 | 35 |
|  | LWL4 | PG16 | 24 | 36 |

PROGRAM ORDER

| Physical WL | Logical WL | Page | 1st PGM | 2nd PGM |
|---|---|---|---|---|
| WL1 | LWL1 | PG1 | 1 | 6 |
| | LWL2 | PG2 | 2 | 8 |
| | LWL3 | PG3 | 3 | 10 |
| | LWL4 | PG4 | 4 | 12 |
| WL2 | LWL1 | PG5 | 5 | 14 |
| | LWL2 | PG6 | 7 | 16 |
| | LWL3 | PG7 | 9 | 18 |
| | LWL4 | PG8 | 11 | 20 |
| WL3 | LWL1 | PG9 | 13 | 22 |
| | LWL2 | PG10 | 15 | 24 |
| | LWL3 | PG11 | 17 | 26 |
| | LWL4 | PG12 | 19 | 28 |
| WL4 | LWL1 | PG13 | 21 | 30 |
| | LWL2 | PG14 | 23 | 32 |
| | LWL3 | PG15 | 25 | 34 |
| | LWL4 | PG16 | 27 | 36 |

| OFFSET VOLTAGE | 2ND PGM START VOLTAGE | STEP VOLTAGE | 1ST PASS VOLTAGE | 2ND PASS VOLTAGE |
|---|---|---|---|---|
| VOFFSET | VPGM_START | VSTEP | VPASS1 | VPASS2 |

| SELECTED WL | OFFSET VOLTAGE | 2ND PGM START VOLTAGE | STEP VOLTAGE | 1ST PASS VOLTAGE | 2ND PASS VOLTAGE |
|---|---|---|---|---|---|
| WL00 | VOFFSET00 | VPGM_START | VSTEP | VPASS1 | VPASS2 |
| WL01 | VOFFSET01 | | | | |
| WL02 | VOFFSET02 | | | | |
| ⋮ | ⋮ | | | | |
| WL15 | VOFFSET15 | | | | |
| WL16 | VOFFSET16 | | | | |

| SELECTED WL (N) | OFFSET VOLTAGE | 2ND PGM START VOLTAGE | STEP VOLTAGE | 1ST PASS VOLTAGE (N+1, N-1) | 1ST PASS VOLTAGE (OTHER) | 2ND PASS VOLTAGE (N+1, N-1) | 2ND PASS VOLTAGE (OTHER) |
|---|---|---|---|---|---|---|---|
| WL00 | VOFFSET00 | VPGM_START | VSTEP | VPASS3 | VPASS4 | VPASS5 | VPASS6 |
| WL01 | VOFFSET01 | | | | | | |
| WL02 | VOFFSET02 | | | | | | |
| ... | ... | | | | | | |
| WL15 | VOFFSET15 | | | | | | |
| WL16 | VOFFSET16 | | | | | | |

132_3

| PROGRAM | PRECHARGE TIME | PASS VOLTAGE APPLICATION TIME | DISCHARGE TIME |
|---|---|---|---|
| 1ST PROGRAM | Tpre1 | Tpass1 | Tdis1 |
| 2ND PROGRAM | Tpre2 | Tpass2 | Tdis2 |

STORAGE DEVICE AND METHOD OF OPERATING THE STORAGE DEVICE

CROSS-REFERENCE TO RELATED APPLICATION

The present application claims priority under 35 U.S.C. § 119(a) to Korean patent application number 10-2020-0097006 filed on Aug. 3, 2020, in the Korean Intellectual Property Office, and Korean patent application number 10-2021-0003589 filed on Jan. 11, 2021, in the Korean Intellectual Property Office, the entire disclosure of which is incorporated by reference herein.

BACKGROUND

1. Technical Field

The present disclosure relates to an electronic device, and more particularly, to a storage device and a method of operating the storage device.

2. Related Art

A storage device is a device that stores data under control of a host device such as a computer or a smartphone. The storage device may include a memory device storing data and a memory controller controlling the memory device. The memory device may be classified into a volatile memory device and a non-volatile memory device.

The volatile memory device may be a device that stores data only when power is supplied and loses the stored data when the power supply is cut off. The volatile memory device may include a static random access memory (SRAM), a dynamic random access memory (DRAM), and the like.

The non-volatile memory device is a device that does not lose data even though power is cut off. The non-volatile memory device includes a read only memory (ROM), a programmable ROM (PROM), an electrically programmable ROM (EPROM), an electrically erasable and programmable ROM (EEPROM), a flash memory, and the like.

SUMMARY

A memory device according to an embodiment of the present disclosure may include a memory cell block including a plurality of memory cells, a peripheral circuit configured to perform a first program operation and a second program operation of storing data in select memory cells connected to a selected word line among the plurality of memory cells, and a program operation controller configured to control the first program operation and the second program operation, the first program operation may be performed using one logical page data among page data to be stored in the select memory cells, and the second program operation may be performed using remaining logical page data except for the one logical page data among the page data.

A memory device according to an embodiment of the present disclosure may include a memory block connected to physical word lines each including a plurality of pages, a peripheral circuit configured to perform a program operation of storing data in the plurality of pages, and control logic configured to control the peripheral circuit, the program operation may include a first program operation of programming a threshold voltage of memory cells included in the plurality of pages to have a threshold voltage of a state of an erase state or an intermediate state and a second program operation of programming the memory cells to have a threshold voltage of any one of the erase state and first to n-th program states (n is a natural number equal to or greater than 2), and the control logic may control the peripheral circuit to perform a first program operation on one of a plurality of pages included in a selected physical word line among the physical word lines, and then perform a second program operation on one of a plurality of pages included in a physical word line on which a first program operation is performed before the selected physical word line.

A storage device according to an embodiment of the present disclosure may include memory devices, and a memory controller configured to provide program commands instructing to store data in the memory devices, each of the memory devices may include a memory block including a plurality of memory cells, a peripheral circuit configured to perform a first program operation and a second program operation of storing the data in select memory cells which are memory cells selected from among the plurality of memory cells, in response to the program command, and a program operation controller configured to control the first program operation and the second program operation, the first program operation may be performed using one logical page data among page data to be stored in the select memory cells, and the second program operation may be performed using remaining logical page data except for the one logical page data among the page data.

BRIEF DESCRIPTION OF THE DRAWINGS

FIGS. 5A and 5B are diagrams illustrating a program operation according to an embodiment of the present disclosure.

FIG. 9A is a diagram illustrating program order information according to an embodiment of the present disclosure.

FIG. 9B is a diagram illustrating the program order information according to another embodiment of the present disclosure.

FIG. 15 is a diagram illustrating an embodiment of a program voltage information storage of FIG. 13.

FIG. 16 is a diagram illustrating another embodiment of the program voltage information storage of FIG. 13.

FIG. 17 is a diagram illustrating another embodiment of the program voltage information storage of FIG. 13.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a storage device having improved reliability and an improved operation speed, and a method of operating the storage device.

According to the present technology, a storage device having improved reliability and an improved operation speed, and a method of operating the same are provided.

Figure 1:
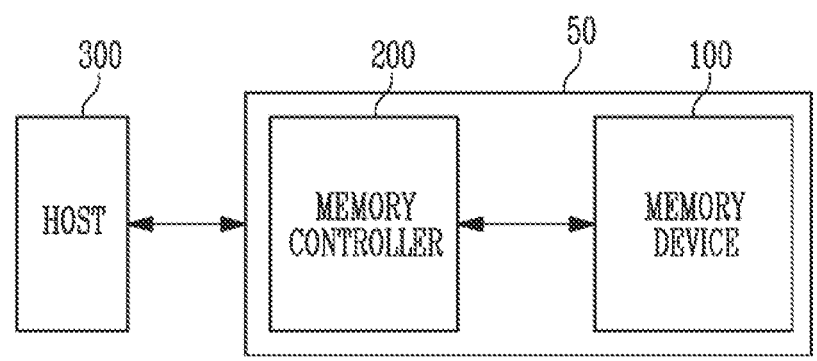
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command CMD and an address ADDR from the memory controller 200 and access an area selected by an address in the memory cell array. The memory device 100 may perform an operation instructed by the command CMD on the area selected by the address ADDR. For example, the memory device 100 may perform a program operation, a read operation, and an erase operation. During the program operation, the memory device 100 may store data in the area selected by the address ADDR. During the read operation, the memory device 100 may read data from the area selected by the address ADDR. During the erase operation, the memory device 100 may erase data stored in the area selected by the address ADDR.

In an embodiment, the memory device 100 may include a plurality of planes. The plane may be a unit capable of independently performing an operation. For example, the memory device 100 may include 2, 4, or 8 planes. The plurality of planes may independently perform the program operation, the read operation, or the erase operation simultaneously. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The memory controller 200 may control an overall operation of the storage device 50.

When power is applied to the storage device 50, the memory controller 200 may execute firmware (FW). When the memory device 100 is a flash memory device, the firmware (FW) may include a host interface layer (HIL) that controls communication with the host 300, a flash translation layer (FTL) that controls communication between the memory controller 200 and the host 300, and a flash interface layer (FIL) that controls communication with the memory device 100.

The memory controller 200 may receive write data and a logical block address (LBA) from the host 300 and may convert the LBA into a physical block address (PBA) indicating an address of memory cells in which data included in the memory device 100 is to be stored. In the present specification, the LBA and a "logic address" or a "logical address" may be used as the same meaning. In the present specification, the PBA and a "physical address" may be used as the same meaning.

The memory controller 200 may control the memory device 100 to perform the program operation, the read operation, the erase operation, or the like according to a request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data on independently regardless of the request from the host 300 and transmit the command, the address, and the data to the memory device 100. For example, the memory controller 200 may provide the command, the address, and the data for performing a read operation and program operations accompanying in performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other. Alternatively, the interleaving method may be a method in which at least two or more memory devices 100 operate in parallel.

A buffer memory (not shown) may temporarily store data provided from the host 300, that is, data to be stored in the memory device 100, or may temporarily store data read from the memory device 100. In an embodiment, the buffer memory (not shown) may be a volatile memory device. For example, the buffer memory (not shown) may be a dynamic random access memory (DRAM) or a static random access memory (SRAM).

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
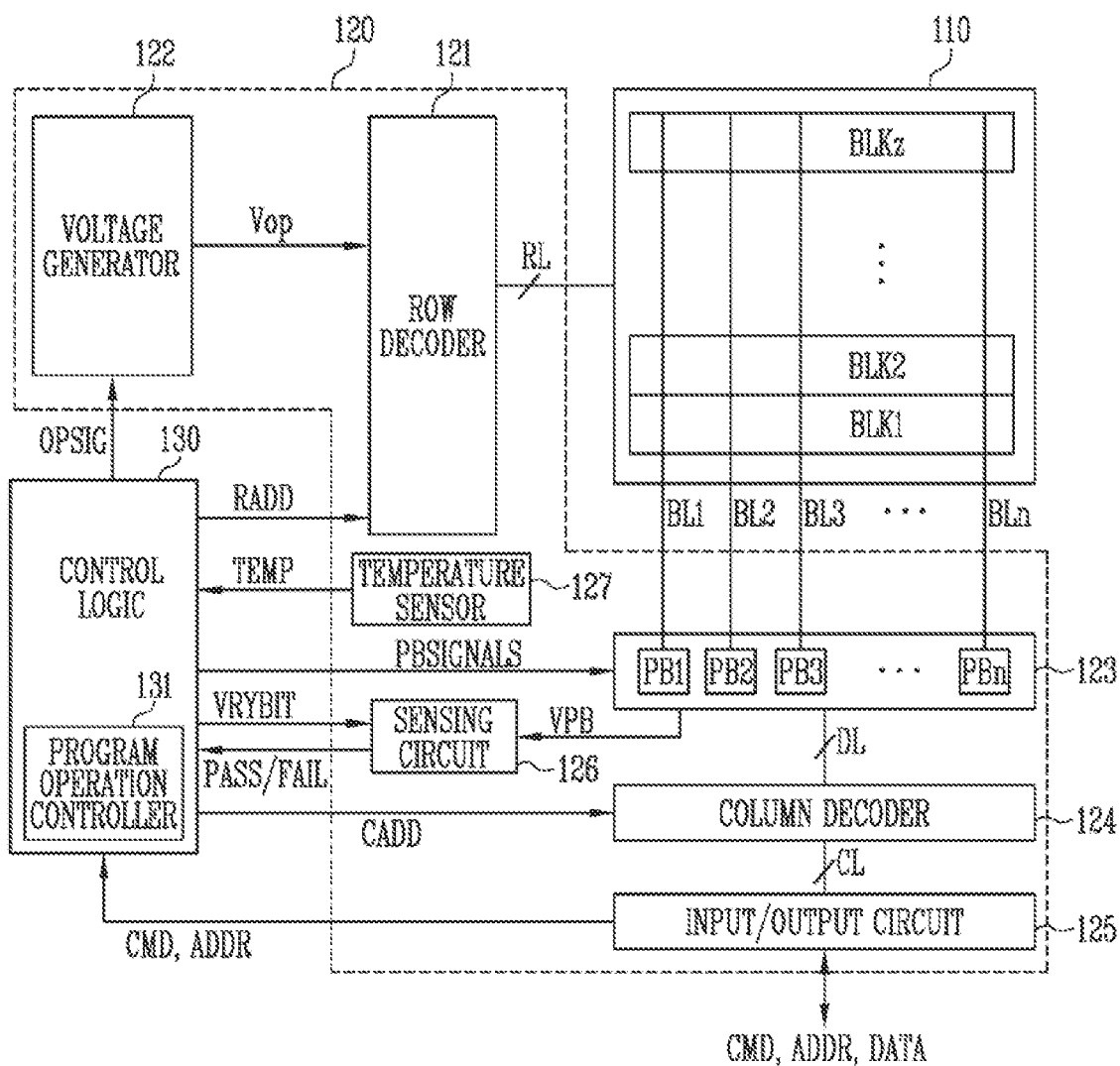
FIG. 2 is diagram illustrating a structure of a memory device of FIG. 1.

FIG. 2 is diagram illustrating a structure of the memory device 100 of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells may be non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to control of the control logic 130. The row decoder 121 receives a row address RADD from the control logic 130.

The row decoder 121 is configured to decode the row address RADD received from the control logic 130. The row decoder 121 selects at least one memory block among the memory blocks BLK1 to BLKz according to a decoded address. In addition, the row decoder 121 may select at least one word line of the memory block to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage of a level higher than the verify voltage to the unselected word line. During the read operation, the row decoder 121 may apply a read voltage to the selected word line and apply a read pass voltage of a level higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. For example, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. For example, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

For example, during the program operation, when the program pulse is applied to the selected word line, the first to n-th page buffers PB1 to PBn may transfer data DATA received from the input/output circuit 125 to the selected memory cell through the first to n-th bit lines BL1 to BLn. The memory cells of the selected page are programmed according to the transferred data DATA. A threshold voltage of the memory cell connected to the bit line to which a program permission voltage (for example, a ground voltage) is applied may rise. The threshold voltage of the memory cell connected to the bit line to which a program inhibit voltage (for example, a power voltage) is applied may be maintained. During the program verify operation, the first to n-th page buffers PB1 to PBn may read data stored in the memory cells from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to a permission bit signal VRYBIT during the read operation or the program verify operation, and compare a sensing voltage VPB received from the page buffer group 123 with a reference voltage generated by the reference current to output a pass signal PASS or a fail signal FAIL.

A temperature sensor 127 may measure a temperature of the memory device 100. The temperature sensor 127 may provide a temperature signal TEMP having a different voltage level according to the measured temperature to the control logic 130. The control logic 130 may generate temperature information TEMP INFO indicating the temperature of the memory device 100 according to the temperature signal TEMP, and output the generated temperature information TEMP INFO to the outside.

The control logic 130 may output the operation signal OPSIG, the row address RADD, the page buffer control signals PBSIGNALS, and the permission bit VRYBIT in response to the command CMD and the address ADDR to control the peripheral circuit 120. In addition, the control logic 130 may determine whether the verity operation is passed or failed in response to the pass or fail signal PASS or FAIL.

According to an embodiment of the present disclosure, the control logic 130 may further include a program operation controller 131. The program operation controller 131 may control the peripheral circuit 120 to perform a program operation of storing data in memory cells. For example, the program operation controller 131 may provide control signals to the peripheral circuit 120.

The program operation may be performed in a page unit. Memory cells commonly connected to one word line may configure a physical page. In an embodiment, the physical page may include at least one or more logical pages. Therefore, page data, which is data stored in the physical page, may include at least one or more of logical page data. For example, when a memory cell is programmed in an SLC mode, the physical page may include one logical page, and the page data may include one logical page data. Alternatively, when the memory cell is programmed in an MLC mode, the physical page may include two logical pages, and the page data may include two logical page data. At this time, the two logical page data may be a least significant bit (LSB) page data and a most significant bit (MSB) page data. Alternatively, when the memory cell is programmed in a TLC mode, the physical page may include three logical pages, and the page data may include three logical page data. At this time, the three logical page data may be a least significant bit (LSB) page data, a central significant bit (CSB) page data, and a most significant bit (MSB) page data. In an embodiment, relating to a TLC mode, one logical page data among page data may be any one of the LSB page data, the CSB page data, or the MSB page data. As such, a remaining logical page data may be any of the page data except for the one logical page data chosen for an operation among the page data. For example, in a TLC mode, if the logical page data chosen for an operation among page data is the LSB page data then the remaining logical page data that may be chosen for another operation is the CSB page data and the MSB page data. For example, if the logical page data chosen for an operation among page data is the CSB page data then the remaining logical page data that may be chosen for another operation is the LSB page data and the MSB page data. In an embodiment, relating to an MLC mode, one logical page data among page data may be any one of the LSB page data or the MSB page data. As such, in an MLC mode, if the logical page data chosen for an operation among page data is the LSB page data then the remaining logical page data that may be chosen for another operation is the MSB page data.

Hereinafter, for convenience of description, it is assumed that the memory cell is programmed in the TLC mode. However, this is for convenience of description, and an embodiment of the present disclosure is not limited thereto.

Before the program operation is performed, the memory cells may have a threshold voltage corresponding to an erase state. When the program operation is performed, memory cells included in a selected page may have a threshold voltage corresponding to any one of the erase state and first to seventh program states according to data stored in each memory cell. For example, according to data to be stored in each memory cell, the memory cell may have any one of the erase state and the first to seventh program states as a target program state. The program operation may be performed on each memory cell to have a threshold voltage of a corresponding target program state.

The conventional program operation is performed in a so-called one shot program method. The one shot program method may include a plurality of program loops. One program loop includes a program voltage apply step of applying a program voltage to a selected word line and a verify step of sensing whether a threshold voltage of each memory cell reaches a threshold voltage corresponding to a target program state. Each time the program loop proceeds, a magnitude of the program voltage applied to the word line may increase by a step voltage compared to a program voltage in a previous program loop. Here, the step voltage may be a preset voltage value. This is called an incremental step pulse program (ISPP) scheme. Even though program loops corresponding to a preset maximum number of loops are performed, when all memory cells connected to the selected word line do not reach the target program state, it may be determined that the program operation is failed.

According to an embodiment of the present disclosure, the program operation may include a first program operation and a second program operation. The first program operation may be an operation of causing the threshold voltage of the memory cells to have a threshold voltage corresponding to any one of the erase state or an intermediate state. The second program operation may be an operation of programming the threshold voltage of the memory cells belonging to the erase state or the intermediate state to have the threshold voltage corresponding to any one of the erase state and the first to seventh program states. In such a program method, when the first program operation is performed, the number of threshold voltage distributions formed by the memory cells is 2, and when the second program operation is performed, the number of threshold voltage distributions formed by the memory cells is 8. Therefore, the program method is also referred to as 2-8 program scheme.

The program operation according to an embodiment of the present disclosure is described with reference to FIGS. 4A to 7 to be described later.

Figure 3:
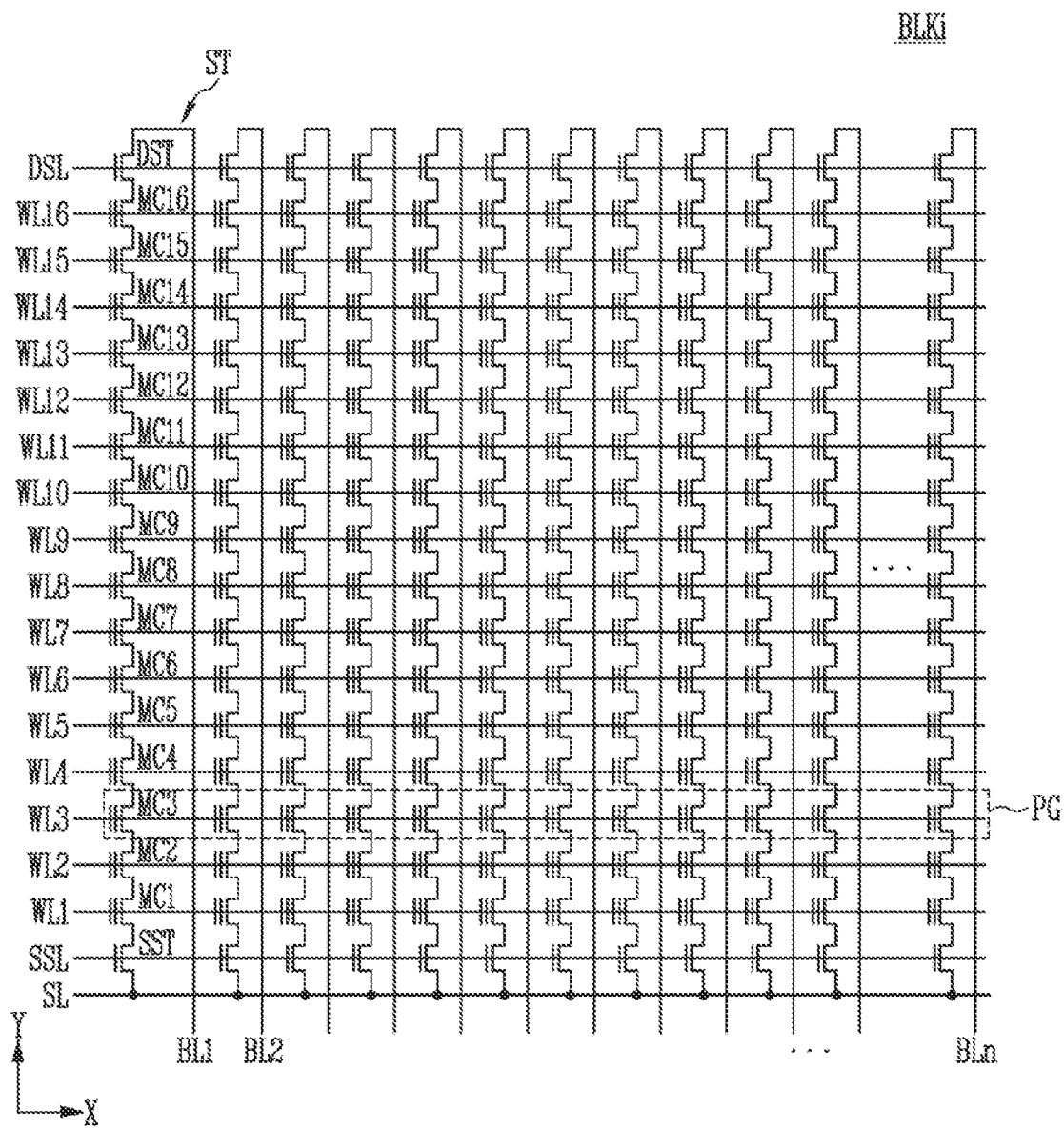
FIG. 3 is a diagram illustrating a structure of any one memory block among memory blocks of FIG. 2.

FIG. 3 is a diagram illustrating a structure of any one memory block BLKi among the memory blocks BLK1 to BLKz of FIG. 2.

Referring to FIG. 3, a plurality of word lines arranged in parallel with each other may be connected between the first select line and the second select line. Here, the first select line may be the source select line SSL, and the second select line may be the drain select line DSL. For example, the memory block 110 may include a plurality of strings ST connected between the bit lines BL1 to BLn and the source line SL. The bit lines BL1 to BLn may be connected to the strings ST, respectively, and the source line SL may be commonly connected to the strings ST. Since the strings ST may be configured to be identical to each other, a string ST connected to the first bit line BL1 will be described, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKi may include the pages PG of the number of the word lines WL1 to WL16.

One memory cell may store one bit of data. This is commonly called a single level cell (SLC). In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

Figure 4A:
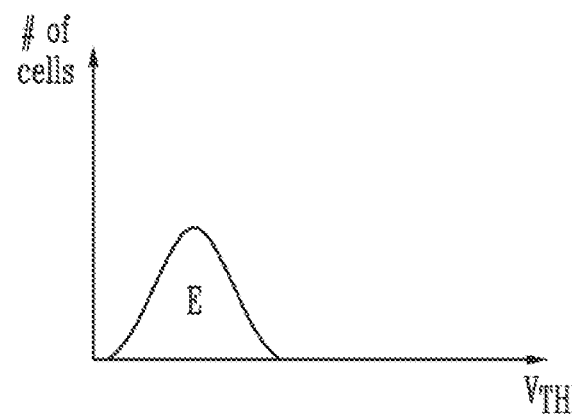
FIGS. 4A and 4B are diagrams illustrating a threshold voltage distribution of a TLC.
Figure 4B:
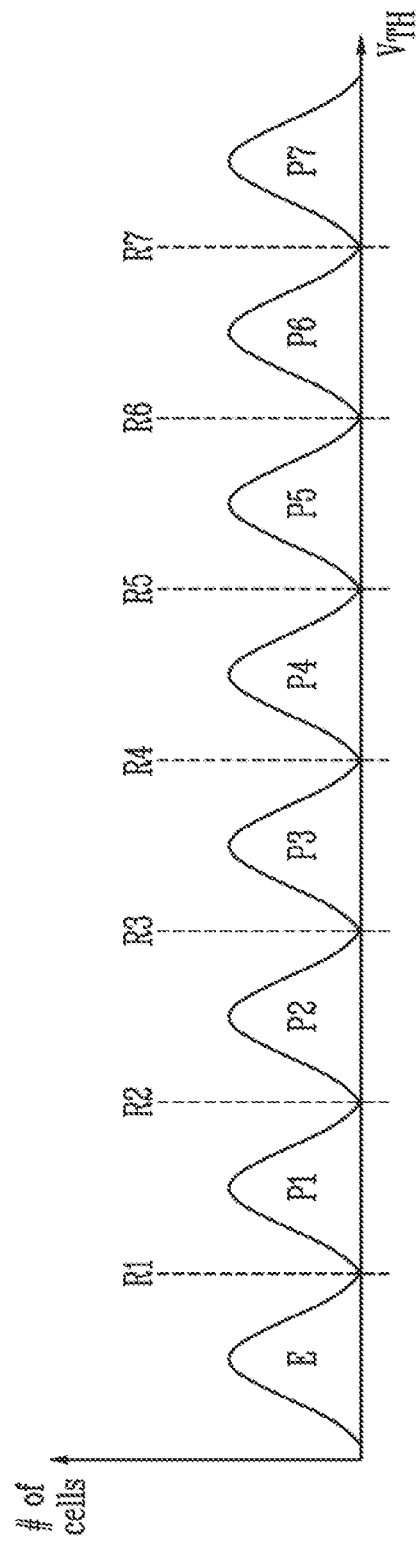

FIGS. 4A and 4B are diagrams illustrating a threshold voltage distribution of a TLC.

Referring to FIGS. 4A and 4B, a horizontal axis of each graph represents a magnitude of the threshold voltage and a vertical axis represents the number of memory cells.

Before the program operation is performed, the memory cell may have the threshold voltage of the erase state (E). After the program operation is completed, the memory cells may have the threshold voltage of any one of the erase state E and the first to seventh program states P1 to P7.

After data is stored in the memory cell, an operation of reading the stored data may be an operation of sensing the memory cells with a read voltage that distinguishes each of states.

A first read voltage R1 may be a voltage for distinguishing between the erase state E and the first program state P1. Since the memory cell having the threshold voltage corresponding to the erase state E has a threshold voltage lower than the first read voltage R1, the memory cell may be read as an on cell. Since the memory cell having the first program state P1 has a threshold voltage higher than the first read voltage R1, the memory cell may be read as an off cell.

The second to seventh read voltages R2 to R7 may be read voltages for distinguishing each of the first to seventh program states P1 to P7. The second read voltage R2 may be a read voltage for distinguishing the first program state P1 and the second program state P2. The third read voltage R3 may be a read voltage for distinguishing the second program state P2 and the third program state P3. In a similar method, the seventh read voltage R7 may be a read voltage for distinguishing the sixth program state P6 and the seventh program state P7.

As the number of data bits stored in one memory cell increases, the number of program states and the number of read voltages for distinguishing each program state may increase.

Figure 5B:
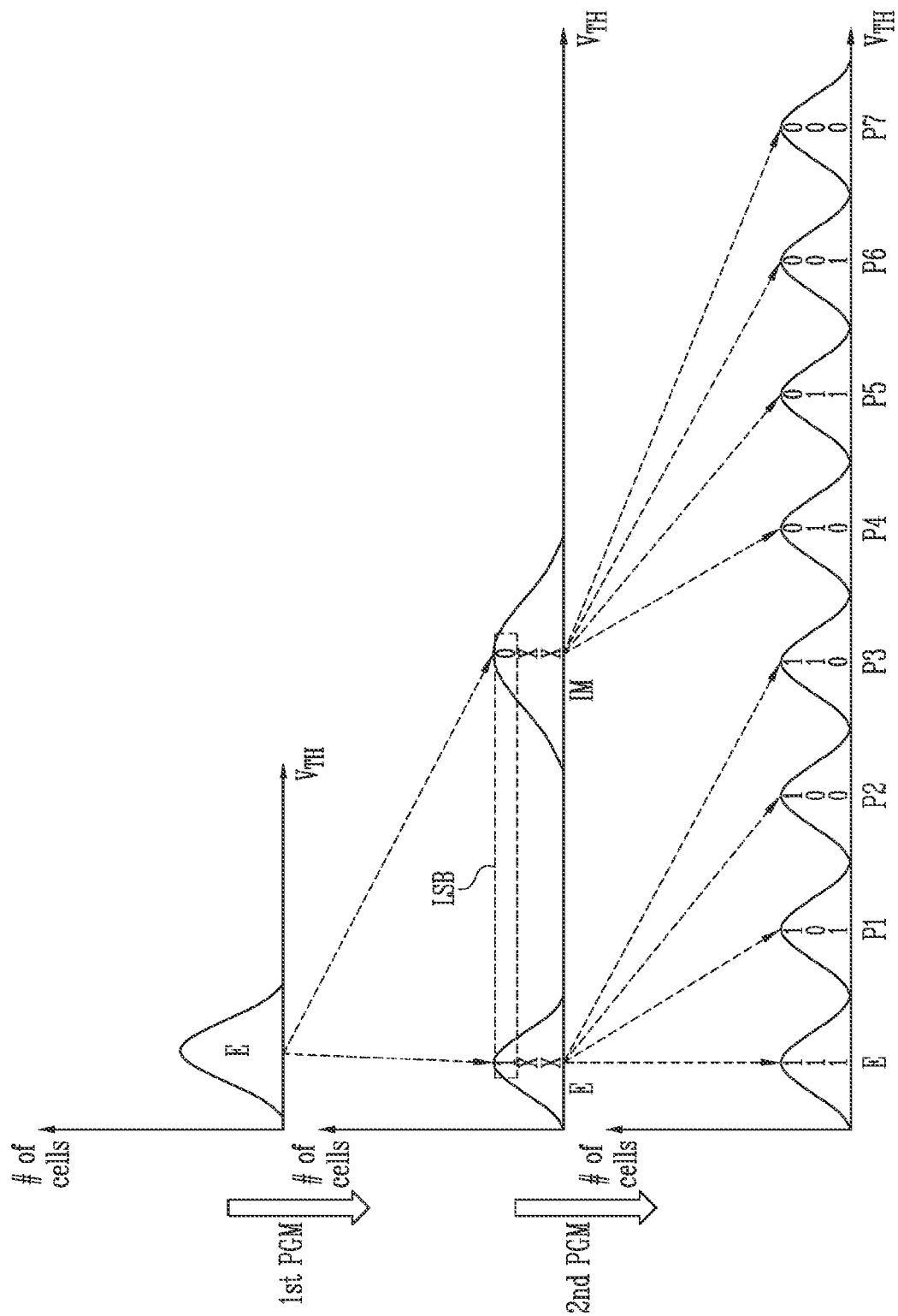

FIGS. 5A and 5B are diagrams illustrating the program operation according to an embodiment of the present disclosure.

Referring to FIGS. 5A and 5B, the first program operation may be an operation of programming the memory cell so that the threshold voltage of the memory cells connected to the selected word line have the threshold voltage corresponding to any one of the erase state E and the intermediate state IM according to the data to be stored in each memory cell. In an embodiment, the magnitude of the threshold voltage corresponding to the intermediate state IM may be larger than the magnitude of the threshold voltage corresponding to the erased state E. In an embodiment, the memory cells to be programmed to the intermediate state IM in the first program operation may be memory cells in which the target program state is any one of the fourth to seventh program states P4 to P7. Conversely, the target program state of the memory cells that maintain the erase state E in the first program operation may be any one of the erase state E and the first to third program states P1 to P3.

In an embodiment, the first program operation 1st PGM may be an operation of providing a fixed program voltage having a voltage of a predetermined magnitude to the memory cells at least once or more. That is, the simplest form of the first program operation 1st PGM may be an operation of providing the fixed program voltage to the word line once. In an embodiment, the first program operation 1st PGM may also include a plurality of program loops. In this case, even though the program loops included in the first program operation 1st PGM proceed, a level of the program voltage applied to the word line does not increase, and the program voltage may be the fixed program voltage having a fixed voltage level. In an embodiment, the first program operation 1st PGM may be a program operation that does not perform a verify step. The word "predetermined" as used herein with respect to a parameter, such as a predetermined magnitude, predetermined size, and predetermined voltage level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

While the fixed program voltage is applied to the word line, any one of the program permission voltage or the program inhibition voltage may be applied to bit lines to which the selected memory cells are respectively connected. For example, the threshold voltage of the memory cell to which the program permission voltage is applied may have a voltage corresponding to the intermediate state IM according to the application of the fixed program voltage. Conversely, the threshold voltage of the memory cell to which the program inhibition voltage is applied may maintain the erase state E.

The second program operation 2nd PGM may be an operation of programming the memory cells having the threshold voltages corresponding to the erase state E and the intermediate state IM to each have a threshold voltage corresponding to the target program state.

After the second program operation 2nd PGM is performed, the memory cells maintaining the erased state E in the first program operation 1st PGM may have the threshold voltage corresponding to any one of the first to third program states P1 to P3. Alternatively, the memory cells programmed to the intermediate state IM in the first program operation may have the threshold voltage corresponding to any one of the fourth to seventh program states P4 to P7.

Referring to FIG. 5B, after the second program operation 2nd PGM is performed, the memory cell corresponding to the erase state E may store data of "111", and the memory cells corresponding to the first program state P1 to the seventh program state P7 may store data of "101", "100", "110", "010", "011", "001", and "000", respectively. Therefore, when the first program operation 1st PGM is performed, the memory cells corresponding to the erase state E may be memory cells to store one of "111", 101", "100", and "110" after the second program operation 2nd PGM is performed thereafter, and the memory cells corresponding to the intermediate state IN may be memory cells to store data of "010", "011", "001", and "000" after the second program operation 2nd PGM is performed thereafter.

That is, the erase state E and the intermediate state IM may be a state that is distinguished only by the LSB page data among the page data. This means that the first program operation 1st PGM may be performed with only the LSB page data.

Hereinafter, a read operation of reading data of memory cells on which the program is completed is described below.

Figure 6A:
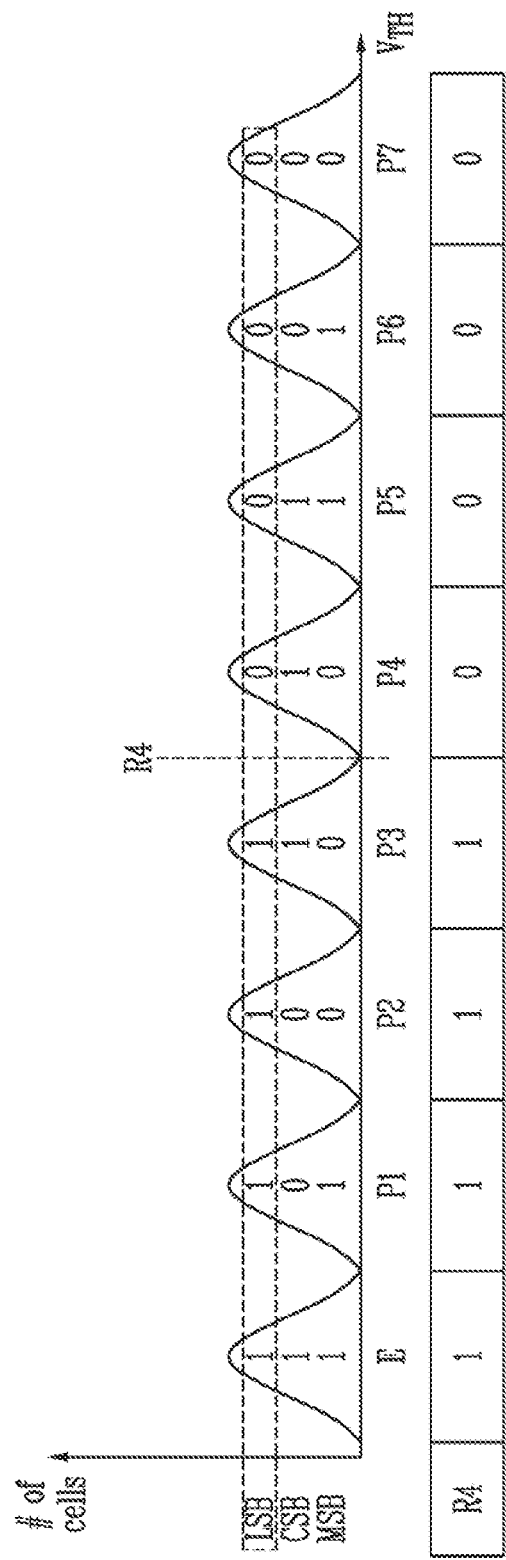
FIG. 6A is a diagram illustrating an operation of reading LSB page data.
Figure 6B:
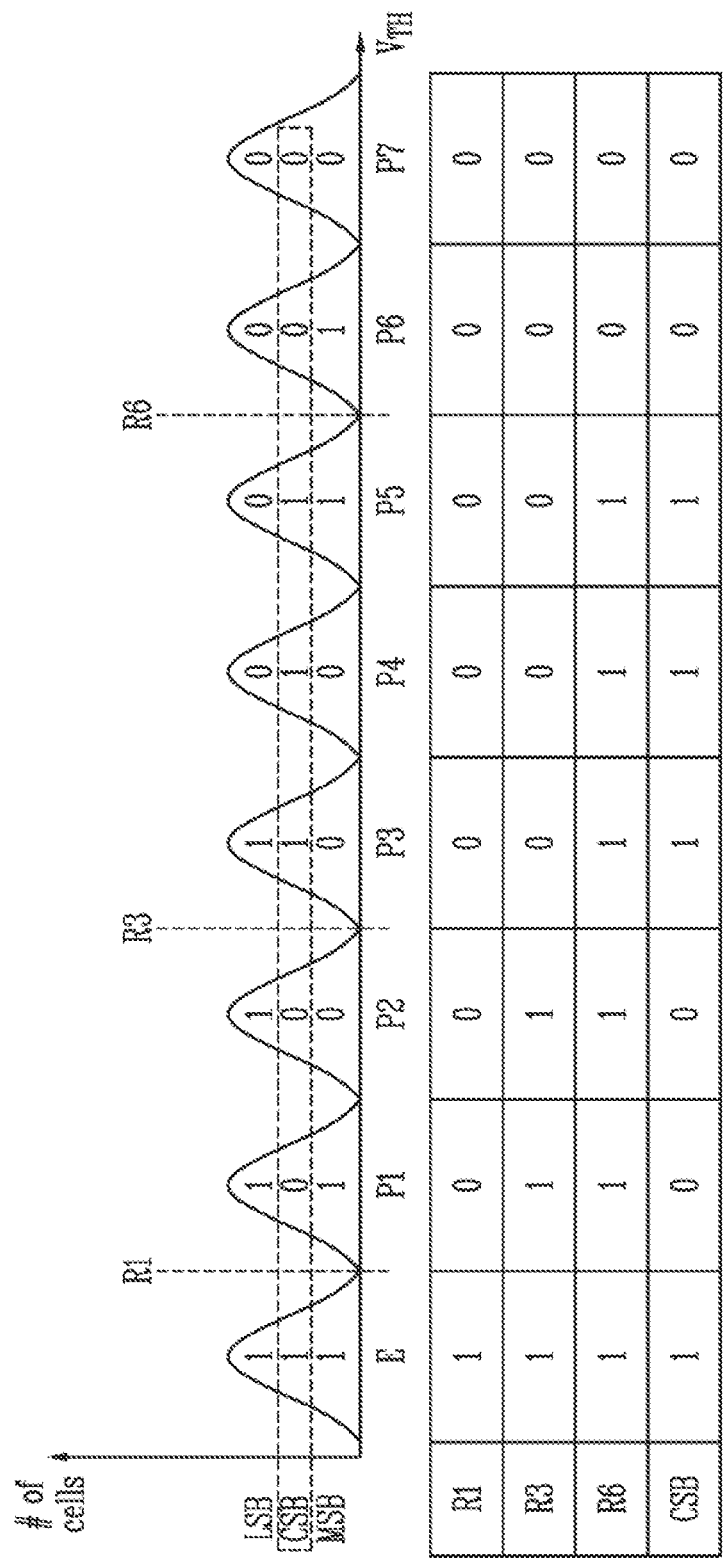
FIG. 6B is a diagram illustrating an operation of reading CSB page data.
Figure 6C:
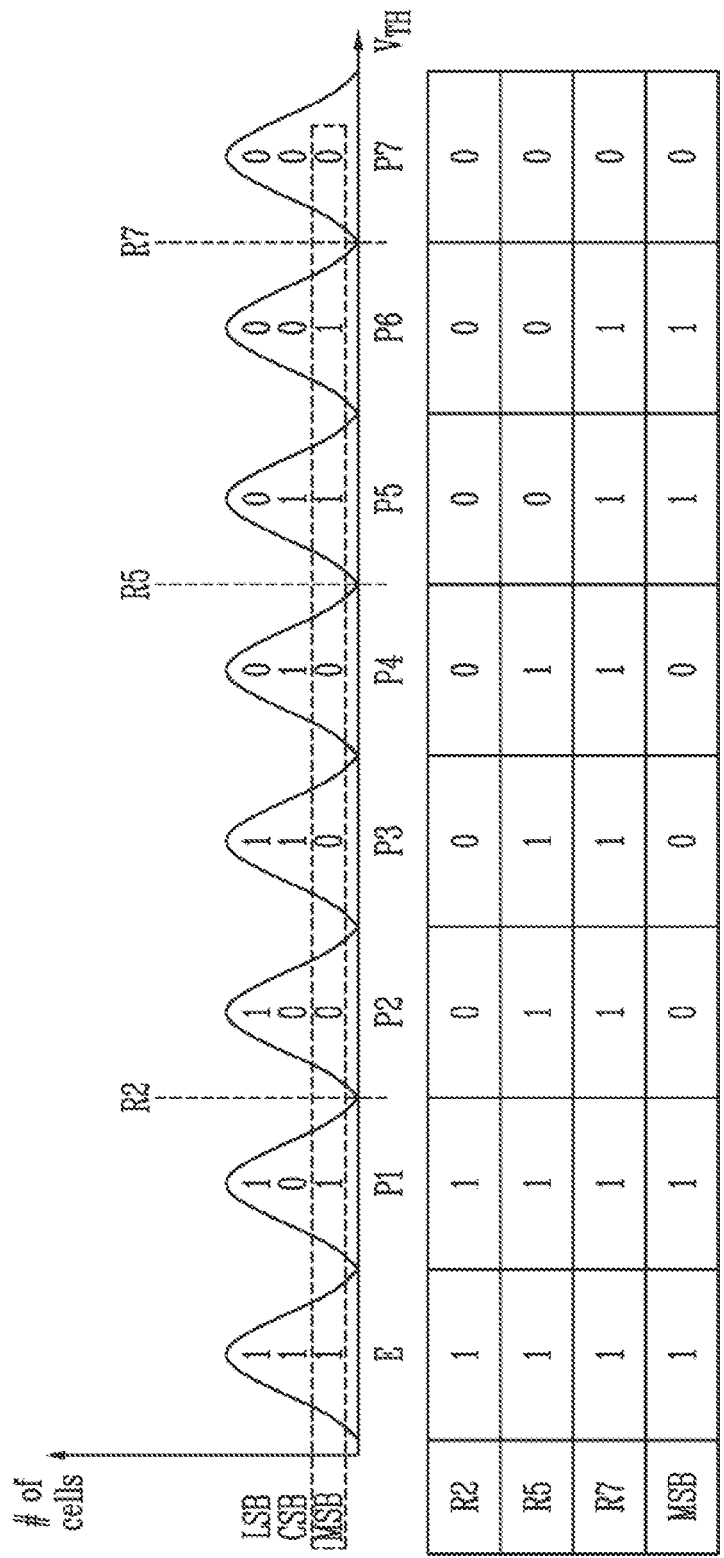
FIG. 6C is a diagram illustrating an operation of reading MSB page data.

FIGS. 6A to 6C are diagrams illustrating data stored in the memory cells and a read method according to an embodiment of the present disclosure.

FIG. 6A is a diagram illustrating an operation of reading the LSB page data.

In a case of the program operation described with reference to FIGS. 5A and 5B, the first program operation 1st PGM may be performed with only the LSB page data. To this end, the LSB page data is required to be distinguished according to one read voltage, and as a result of the distinguishment, it is helpful for reliability that the number of target program states of the memory cells in which the LSB page data is "1" or the memory cells in which the LSB page data is "0" are similar.

Therefore, in consideration of this, as shown in FIG. 6A, it is necessary to read the LSB page data through one sensing using the fourth read voltage R4 to perform the program operation described with reference to FIGS. 5A and 5B.

The LSB page data of the memory cells corresponding to the erase state E and the first to third program states P1 to P3 may be "1", and the LSB page data of the memory cells corresponding to the fourth to seventh program state P4 to P7 may be "0".

FIG. 6B is a diagram illustrating an operation of reading CSB page data.

Referring to FIG. 6B, the CSB page data may be obtained through a sensing operation according to three different read voltages.

For example, the CSB page data may be obtained through sensing using the first read voltage R1, the third read voltage R3, and the sixth read voltage R6. The CSB data of the memory cell determined as the on cell by the first read voltage R1 may be "1". The CSB data of the memory cells determined as the off cell by the read voltage R1 and determined as the on cell by the third read voltage R3 may be "0". The CSB data of the memory cells determined as the off cell by the third read voltage R3 and determined as the on cell by the sixth read voltage R6 may be "1". The CSB data of the memory cells determined as the off cell by the sixth read voltage R6 may be "0".

FIG. 6C is a diagram illustrating an operation of reading the MSB page data.

Referring to FIG. 6C, the MSB page data may be obtained through a sensing operation according to three different read voltages.

For example, the MSB page data may be obtained through sensing using the second read voltage R2, the fifth read voltage R5, and the seventh read voltage R7. The MSB data determined as the on cell by the second read voltage R2 may be "1". The MSB data of the memory cells determined as the off cell by the second read voltage R2 and determined as the on cell by the fifth read voltage R5 may be "0". The MSB data of the memory cells determined as the off cell by the fifth read voltage R5 and determined as the on cell by the seventh read voltage R7 may be "1". The CSB data of the memory cells determined as the off cell by the seventh read voltage R7 may be "0".

When data Is stored according to a gray code described with reference to FIGS. 6A to 6C, there might not be a disadvantage in performing the read operation compared to other types of gray codes.

That is, each of the number of read voltages used for a CSB read operation performed to obtain the CSB page data and the number of read voltages used for an MSB read operation performed to obtain the MSB page data is three. However, considering that the read voltages used for the LSB read, the CSB read, and the MSB read are the same as seven to read data stored in the TLC, the first program operation 1st PGM may be performed with only the LSB page data without reducing entire read performance, and thus a program speed may be improved.

Figure 7:
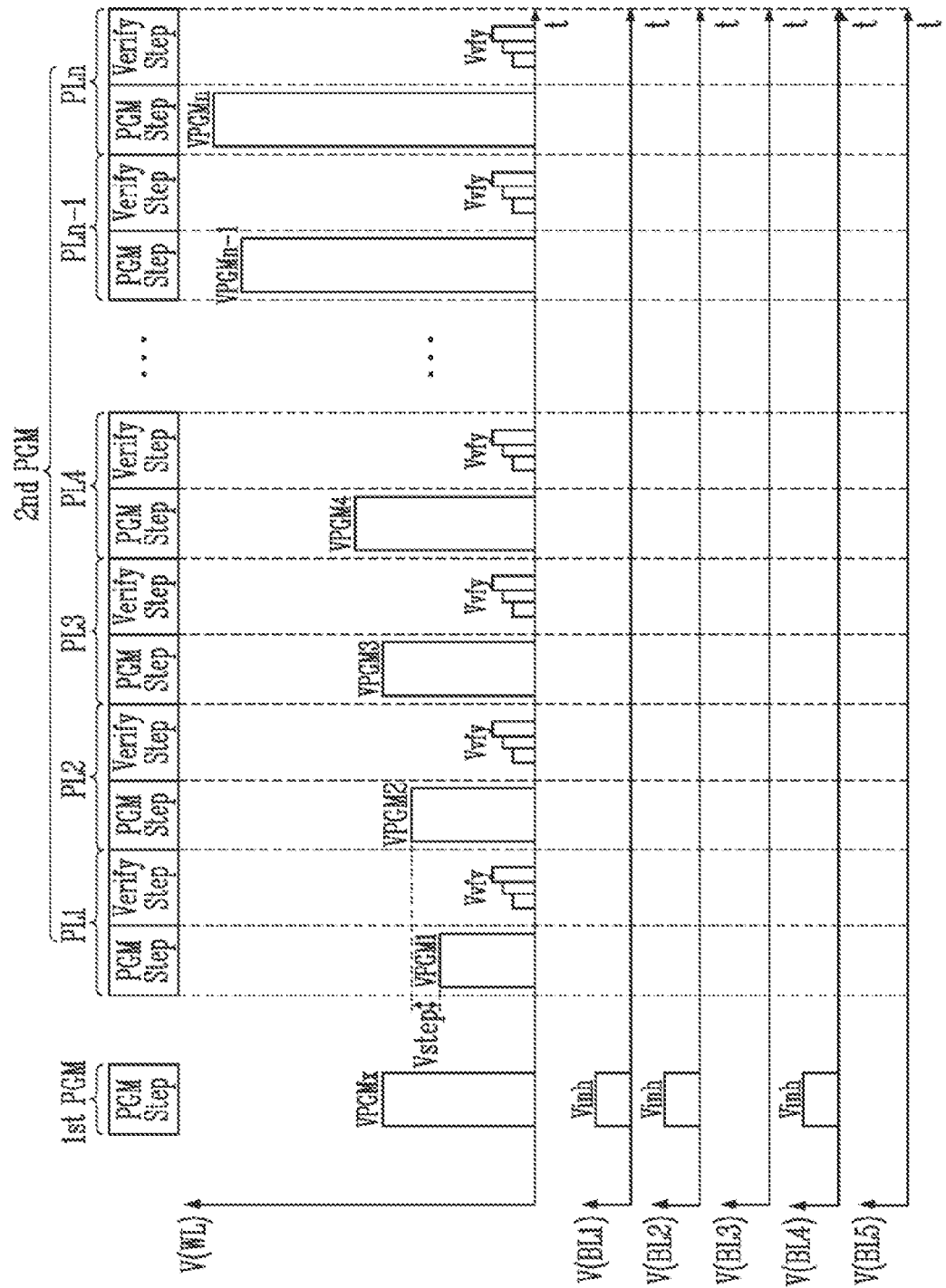
FIG. 7 is a diagram illustrating a voltage applied to a word line and bit lines during the program operation according to an embodiment of the present disclosure.

FIG. 7 is a diagram illustrating a voltage applied to the word line and the bit lines during the program operation according to an embodiment of the present disclosure.

Referring to FIG. 7, the first program operation 1st PGM may be an operation of programming the memory cell so that the threshold voltage of the memory cells connected to the selected word line have the threshold voltage corresponding to any one of the erase state E and the intermediate state IM according to the data to be stored in each memory cell. In an embodiment, the magnitude of the threshold voltage corresponding to the intermediate state IM may be larger than the magnitude of the threshold voltage corresponding to the erased state E. In an embodiment, the memory cells to be programmed to the intermediate state IM in the first program operation 1st PGM may be the memory cells in which the target program state is any one of the fourth to seventh program states P4 to P7. Conversely, the target program state of the memory cells that maintain the erase state E in the first program operation may be any one of the erase state E and the first to third program states P1 to P3.

In FIG. 7, it is assumed that a target threshold voltage of the memory cells connected to the first bit line BL1, the second bit line BL2, and the fourth bit line BL4 are in the third program state P3.

In the first program operation 1st PGM, a fixed program voltage VPGMx having a voltage of a predetermined size may be applied to the selected word line. FIG. 7 shows a case where the fixed program voltage VPGMx is applied once during the first program operation 1st PGM, in various embodiments, the fixed program voltage VPGMx may be provided to the memory cells twice or more. In an embodiment, the first program operation 1st PGM may also include a plurality of program loops. In this case, even though the program loops included in the first program operation 1st PGM proceed, the level of the program voltage applied to the word line does not increase, and the program voltage may be the fixed program voltage having the fixed voltage level. In an embodiment, the first program operation 1st PGM may be a program operation that does not perform a verify step.

When the fixed program voltage VPGMx is applied to the word line, a program inhibition voltage Vinh may be applied to the bit lines BL1, BL2, and BL4 to which the memory cells having the erase state E and the first to third program states P1 to P3 as the target program states are connected. In an embodiment, the program inhibition voltage Vinh may have a level of a power voltage Vcc of the memory device. When the fixed program voltage VPGMx is applied to the word line, a program permission voltage (0 V) may be applied to the bit lines BL3 and BL5 to which the memory cells having any one of the fourth to seventh program states P4 to P7 as the target program state are connected.

In various embodiments, the first program operation 1st PGM may be performed through one application of the fixed program voltage VPGMx, performance of the verify step, and application of an additional program voltage. That is, the number of times the program voltage is applied and whether the verify step is performed during the first program operation 1st PGM are not limited according to the embodiment described with reference to FIG. 7.

The second program operation 2nd PGM may include a plurality of program loops PL1 to PLn. One program loop includes a program voltage apply step PGM Step of applying a program voltage to a selected word line and a verify step of sensing whether a threshold voltage of each memory cell reaches a threshold voltage corresponding to a target program state. Each time the program loop proceeds, a magnitude of the program voltage applied to the word line may increase by a step voltage Vstep compared to a program voltage in a previous program loop. Here, the step voltage may be a preset voltage value. This is called an incremental step pulse program (ISPP) scheme. Even though program loops corresponding to a preset maximum number of loops are performed, when all memory cells connected to the selected word line do not reach the target program state, it may be determined that the program operation is failed. In various embodiments, the number of program states verified in each program loop may be at least two or more program states.

Figure 8:
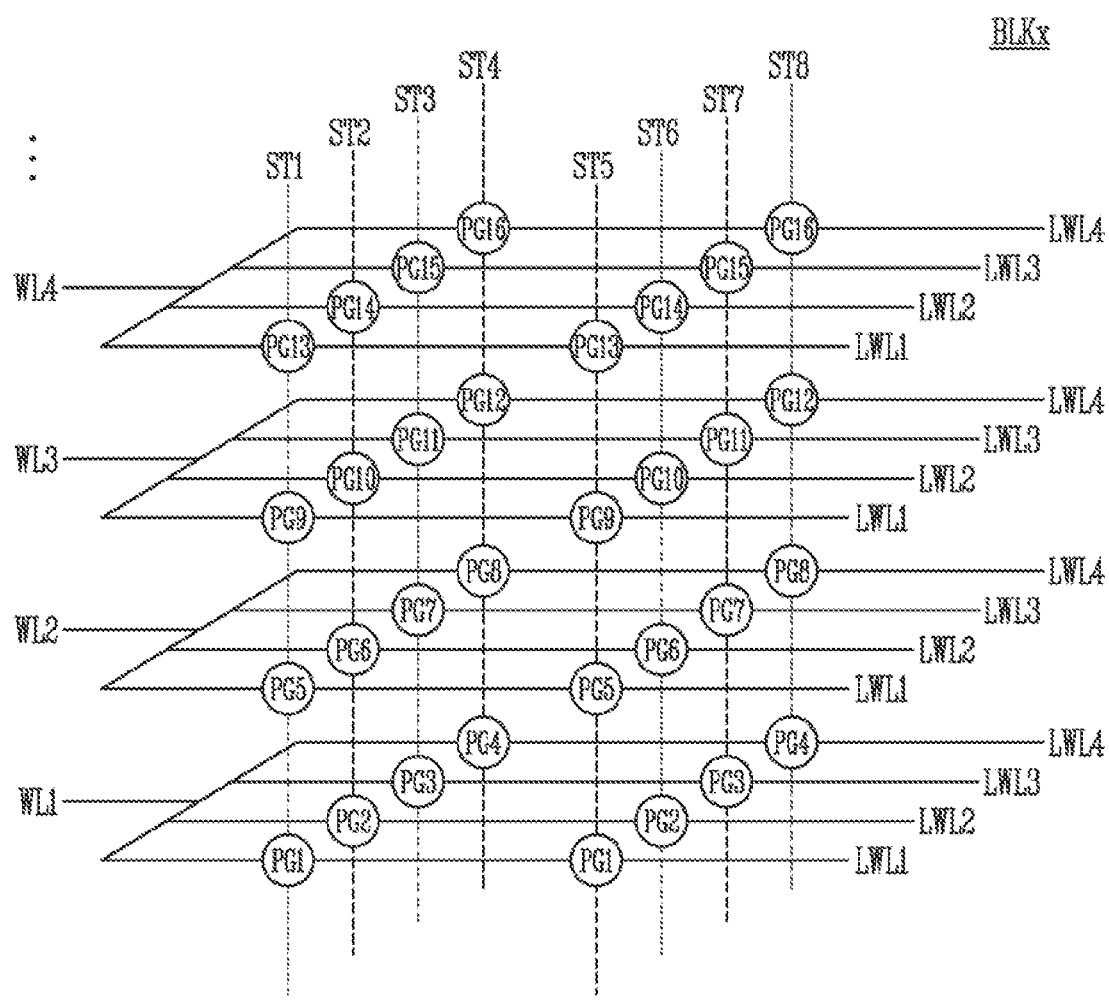
FIG. 8 is a diagram illustrating a program order of pages included in the memory block.

FIG. 8 is a diagram illustrating a program order of the pages included in the memory block.

Referring to FIG. 8, the memory block BLKx may be connected to a plurality of physical word lines. One physical word line may be commonly connected to four logical word lines. Memory cells connected to any one of the logical word lines may configure one page. For example, each of first to fourth physical word lines WL1 to WL4 may be commonly connected to first to fourth logical word lines LWL1 to LWL4.

In an embodiment, first to fourth strings ST1 to ST4 may be commonly connected to the same bit line. Fifth to eighth strings ST5 to ST8 may be commonly connected to the same bit line.

FIG. 8 illustrates a structure in which four strings included in one memory block are connected to the same bit line as an example, but this is for convenience of description, and the number of strings commonly connected to the bit line may be less or more than four.

For example, the number of logical word lines connected to one physical word line may be determined according to the number of strings commonly connected to one bit line. For example, when five strings are commonly connected to one bit line, one physical word line may be commonly connected to five local word lines. In this case, one physical word line may include five pages. Among the five pages, a programmed string and a string that is not programmed may be determined according to a string select signal (for example, signals applied to the drain select line or the source select line of FIG. 3).

The first logical word line LWL1 may be selected by the first string ST1 and the fifth string ST5. The second logical word line LWL2 may be selected by the second string ST2 and the sixth string ST6. The third logical word line LWL3 may be selected by the third string ST3 and the seventh string ST7. The fourth logical word line LWL4 may be selected by the fourth string ST4 and the eighth string ST8. One page may be selected by one logical word line and one physical word line.

That is, the first physical word line WL1 may include first to fourth pages PG1 to PG4. The second physical word line WL2 may include fifth to eighth pages PG5 to PG8. The third physical word line WL3 may include ninth to twelfth pages PG9 to PG12. The fourth physical word line WL4 may include thirteenth to sixteenth pages PG13 to PG16.

FIG. 9A is a diagram illustrating program order information according to an embodiment of the present disclosure.

Referring to FIG. 9A, the program order information may include information on a program order of the pages included in the memory blocks BLK1 to BLKz of FIG. 2.

In an embodiment, the program order information may be stored in the control logic described with reference to FIG. 2. For example, the control logic may include a program order information storage that stores the program order information. Here, the program order information storage may be implemented as a register.

The program operation controller described with reference to FIG. 2 may perform the program operation according to the program order information stored in the program order information storage.

Referring to FIGS. 8 and 9A, first, the first program operation 1st PGM on the first page PG1 to the fourth page PG4 may be sequentially performed (1 to 4). Thereafter, before the second program operation 2nd PGM on the first page PG1 to the fourth page PG4 is performed, the first program operation 1st PGM on the fifth page PG5 to the eighth page PG8 may be performed (5-8). Next, the second program operation 2nd PGM on the first page PG1 to fourth page PG4 may be performed (9-12). That is, according to the program order according to the embodiment of FIG. 9A, after the first program operation 1st PGM is sequentially performed on pages configured by each of the plurality of logical word lines included in the selected physical word line, the second program operation 2nd PGM may be performed on pages configured by each of the plurality of logical word lines included in the physical word line on which the first program operation 1st PGM is performed before the selected physical word line. In a case where the data is stored according to the program order according to the embodiment of FIG. 9A, after the first program operation 1st PGM or the second program operation 2nd PGM on one physical word line is performed, a program operation on a next physical word line is performed. Therefore, a change of a threshold voltage due to a program disturb or a pass disturb between the physical word lines may be reduced, FIG. 9B is a diagram illustrating the program order information according to another embodiment of the present disclosure.

Referring to FIG. 9B, the program order information may include information on the program order of the pages included in the memory blocks BLK1 to BLKz of FIG. 2.

In an embodiment, the program order information may be stored in the control logic described with reference to FIG. 2. For example, the control logic may include the program order information storage that stores the program order information. Here, the program order information storage may be implemented as a register.

The program operation controller described with reference to FIG. 2 may perform the program operation according to the program order information stored in the program order information storage.

Referring to FIGS. 8 and 9B, first, the first program operation 1st PGM on the first page PG1 to the fourth page PG4 may be sequentially performed (1 to 4). Thereafter, while the second physical word line WL2 and the first physical word line WL1 are alternately selected, the program operation may be sequentially performed for each of the logical word lines LWL1 to LWL4.

For example, before the second program operation 2nd PGM on the first page PG1 to the fourth page PG4 is performed, the first program operation 1st PGM on the fifth page PG5 connected to the first logical word line of the second physical word line WL2 may be performed. Thereafter, the second program operation 2nd PGM on the first page PG1 may be performed. Next, the first program operation 1st PGM on the sixth page PG6, the second program operation 2nd PGM on the second page PG2, the first program operation 1st PGM on the seventh page PG7, the second program operation 2nd PGM on the third page PG3, the first program operation 1st PGM on the eighth page PG8, and the second program operation 2nd PGM on the fourth page PG4 may be performed.

That is, according to the program order according to the embodiment of FIG. 9B, the first program operation 1st PGM on the pages configured by each of the plurality of logical word lines included in the selected physic& word line may be performed alternately with the second program operation 2nd PGM on the pages configured by each of the logical word lines on which the first program operation 1st PGM is performed before.

In a case where the data is stored according to the program order according to the embodiment of FIG. 9B, as in the case where the data is stored according to the program order according to the embodiment of FIG. 9A, after the first program operation 1st PGM or the second program operation 2nd PGM on one physical word line is performed, a program operation on a next physical word line is performed. Therefore, a change of a threshold voltage due to a program disturb or a pass disturb between the physical word lines may be reduced.

Figure 10:
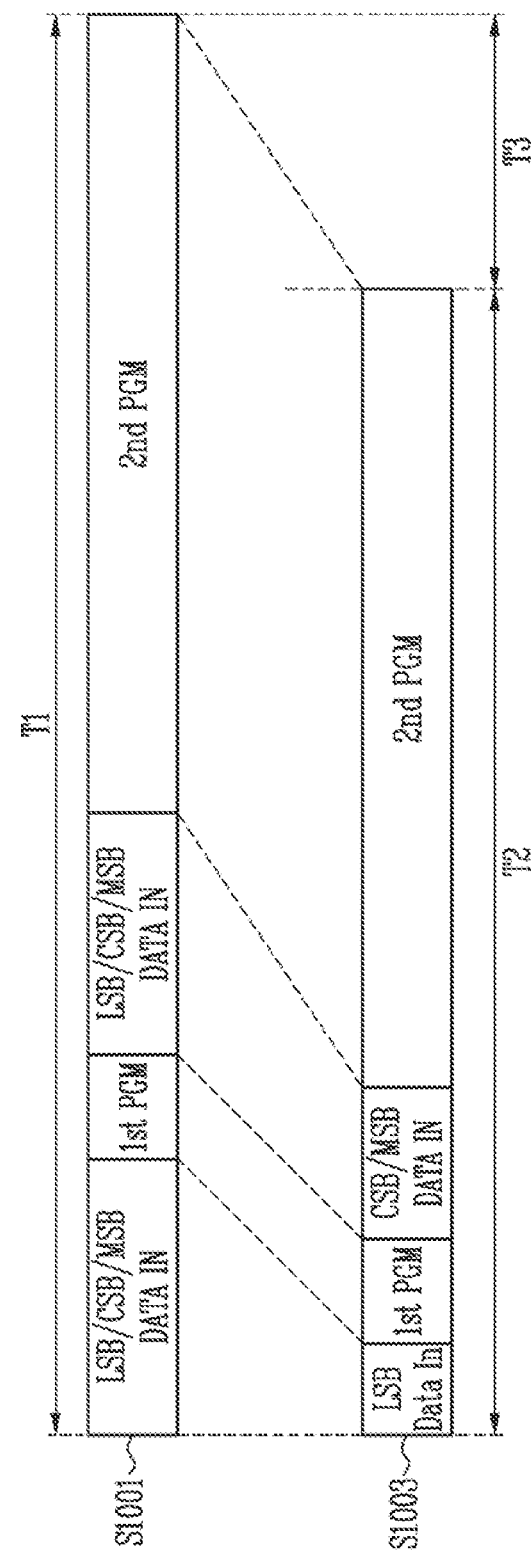
FIG. 10 is a diagram illustrating a type of a 2-8 program method according to an embodiment of the present disclosure.

FIG. 10 is a diagram illustrating a type of the 2-8 program method according to an embodiment of the present disclosure.

Referring to FIG. 10, S1001 indicates a program operation time T1 in a case where all of the LSB page data, the CSB page data, and the MSB page data are required when the first program operation 1st PGM and the second program operation 2nd PGM are performed.

S1003 indicates a program operation time T2 in a case where only the LSB page data is required in the first program operation 1st PGM and all of the LSB page data, the CSB page data, and the MSB page data are required in the second program operation 2nd PGM.

Comparing S1001 with S1003, time for performing the first program operation 1st PGM and the second program operation 2nd PGM is similar in both cases. However, according to an embodiment of the present disclosure, since only the LSB page data is required to perform the first program operation 1st PGM, a length of a data input period before the first program operation 1st PGM is shorter than that of S1001.

As a result, according to the program method according to an embodiment of the present disclosure, a program operation time may be reduced by T3.

Figure 11:
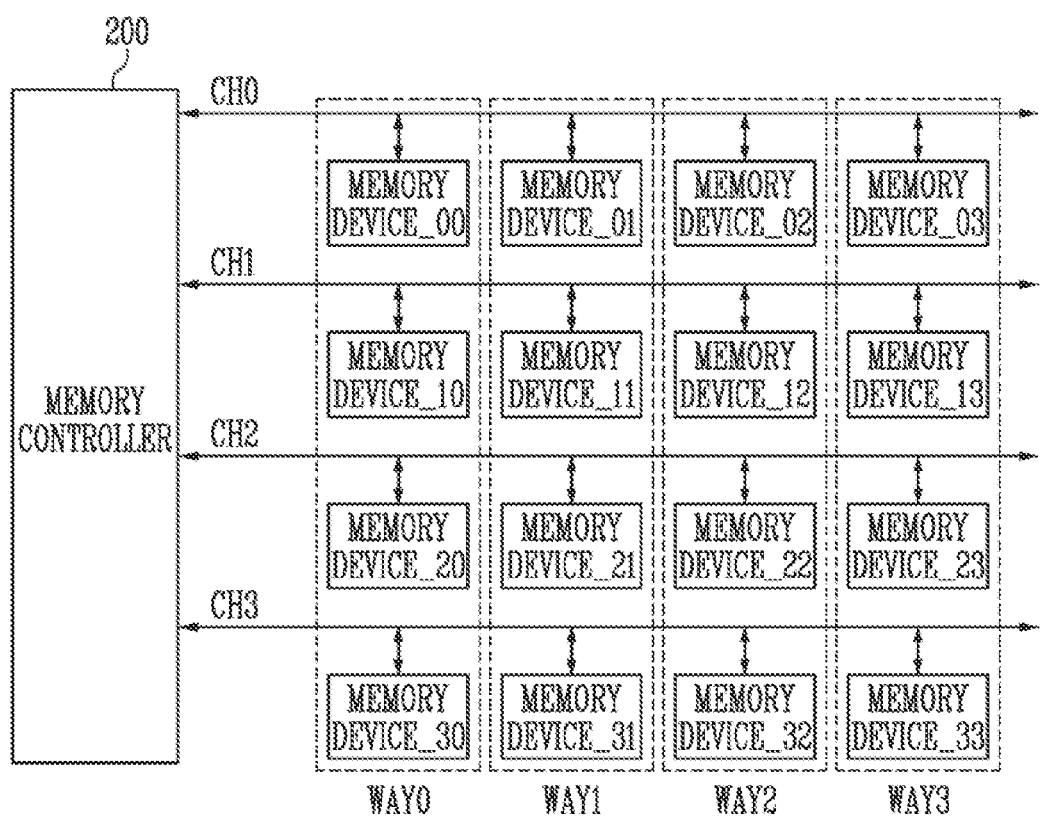
FIG. 11 is a block diagram illustrating an example of a connection relationship between a memory controller of FIG. 1 and a plurality of memory devices.

FIG. 11 is a block diagram illustrating an example of a connection relationship between the memory controller of FIG. 1 and a plurality of memory devices.

Referring to FIG. 11, the memory controller 200 may be connected to the plurality of memory devices (memory devices_00 to _33) through a plurality of channels CH0 to CH3. In an embodiment, it will be appreciated that the number of channels or the number of memory devices connected to each channel may be variously changed. However, for convenience of description, in the present specification, it is assumed that the memory controller 200 is connected to the memory devices through four channels and four memory devices are connected to each channel.

The memory device_00, the memory device_01, the memory device_02, and the memory device_03 may be commonly connected to the channel 0 CH0. The memory device_00, the memory device_01, the memory device_02, and the memory device_03 may communicate with the memory controller 200 through the channel 0 CH0. Since the memory device_00, the memory device_01, the memory device_02, and the memory device_03 are commonly connected to the channel 0 CH0, only one memory device may communicate with the memory controller 200 at once. However, each of the memory device_00, the memory device_01, the memory device_02, and the memory device_03 may simultaneously perform operations internally.

The memory device_10, the memory device_11, the memory device_12, and the memory device_13 may be commonly connected to a channel 1 CH1. The memory device_10, the memory device_11, the memory device_12, and the memory device_13 may communicate with the memory controller 200 through the channel 1 CH1. Since the memory device_10, the memory device_11, the memory device_12, and the memory device_13 are commonly connected to the channel 1 CH1, only one memory device may communicate with the memory controller 200 at once. However, each of the memory device_10, the memory device_11, the memory device_12, and the memory device_13 may simultaneously perform operations internally.

A memory device_20, a memory device_21, a memory device_22, and a memory device_23 may be commonly connected to a channel 2 CH2. The memory device_20, the memory device_21, the memory device_22, and the memory device_23 may communicate with the memory controller 200 through the channel 2 CH2. Since the memory device_20, the memory device_21, the memory device_22, and the memory device_23 are commonly connected to the channel 2 CH2, only one memory device may communicate with the memory controller 200 at once. However, each of the memory device_20, the memory device_21, the memory device_22, and the memory device_23 may simultaneously perform operations internally.

A memory device_30, a memory device_31, a memory device_32, and a memory device_33 may be commonly connected to a channel 3 CH3. The memory device_30, the memory device_31, the memory device_32, and the memory device_33 may communicate with the memory controller 200 through the channel 3 CH3. Since the memory device_30, the memory device_31, the memory device_32, and the memory device_33 are commonly connected to the channel 3 CH3, only one memory device may communicate with the memory controller 200 at once. However, each of the memory device_30, the memory device_31, the memory device_32, and the memory device_33 may simultaneously perform operations internally.

A storage device using the plurality of memory devices may improve performance using data interleaving, which is data communication using an interleave method. The data interleaving may be performing a read or write operation while moving a way in a structure in which two or more ways share one channel. For the data interleaving, the memory devices may be managed in channel and way units. In order to maximize parallelism of the memory devices connected to each channel, the memory controller 200 may distribute consecutive logical memory areas into the channel and way and allocate the consecutive logical memory areas.

For example, the memory controller 200 may transmit a control signal including a command and an addresses, and data to the memory device_00 through the channel 0 CH0. While the memory device_00 programs the transmitted data in a memory cell included therein, the memory controller 200 transmits the control signal including the command and the address, and data to the memory device_01.

As shown in FIG. 11, the plurality of memory devices may be configured of four ways WAY0 to WAY3. The way0 WAY0 may include the memory device_00, the memory device_10, the memory device_20, and the memory device_30. The way1 WAY1 may include the memory device_01, the memory device_11, the memory device_21, and the memory device_31. The way2 WAY2 may include the memory device_02, the memory device_12, the memory device_22, and the memory device_32. The way3 WAY3 may include the memory device_03, the memory device_13, the memory device_23, and the memory device_33.

Each of the channels CH0 to CH3 may be a bus of signals shared and used by the memory devices connected to a corresponding channel.

The data interleaving in the 4 channel/4 way structure is described with reference to FIG. 11. However, interleaving efficiency may be more efficient as the number of channels increases and the number of ways increases.

Figure 12:
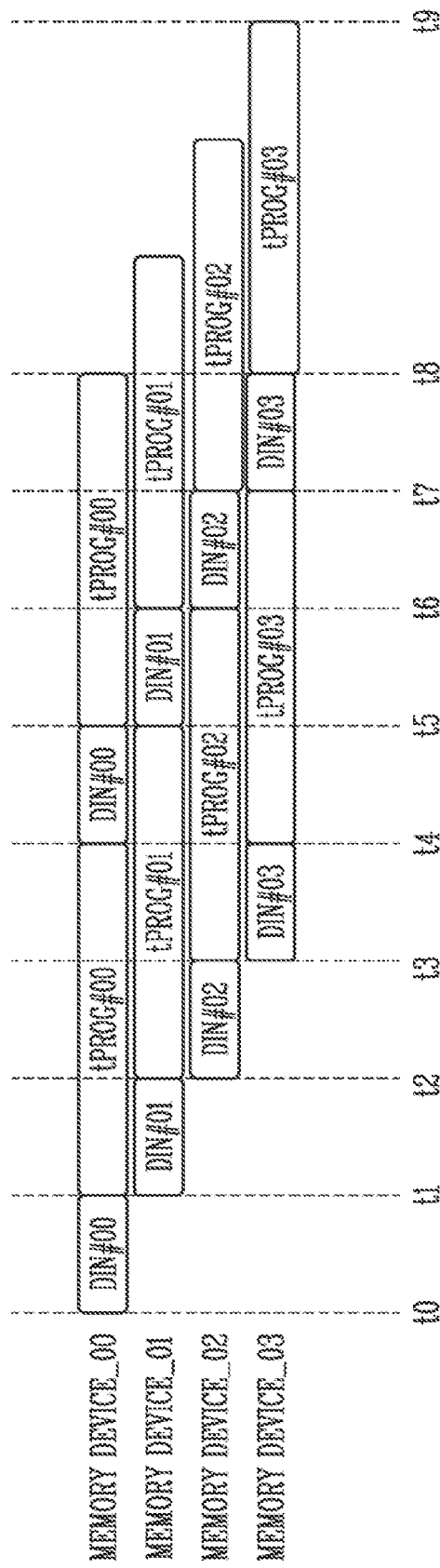
FIG. 12 is a timing diagram illustrating the program operation according to data interleaving.

FIG. 12 is a timing diagram illustrating the program operation according to the data interleaving.

In FIG. 12, for convenience of description, it is assumed that the program operation is performed on the memory device_00 to the memory device_03 commonly connected to the channel 0 CH0 of FIG. 11.

In t0 to t1, data input DIN#00 to the memory device_00 may be performed. The memory device_00 may receive a program command, an addresses, and data through the channel 0 CH0 while the data input DIN#00 is performed. Since the memory device_00, the memory device_01, the memory device_02, and the memory device_03 are commonly connected to the channel 0 CH0, the memory device_01, the memory device_02, and the memory device_03 which are the remaining memory devices might not use the channel 0 CH0 while the data input DIN#00 to the memory device_00 is performed.

In t1 to t2, data input DIN#01 to the memory device_01 may be performed. The memory device_01 may receive a program command, an addresses, and data through the channel 0 CH0 while the data input DIN#01 is performed. Since the memory device_00, the memory device_01, the memory device_02, and the memory device_03 are commonly connected to the channel 0 CH0, the memory device_00, the memory device_02, and the memory device_03 which are the remaining memory devices might not use the channel 0 CH0 while the data input DIN#01 to the memory device_01 is performed. However, since the memory device_00 receives the data in a period t0 to t1 (DIN#00), the memory device_00 may perform the program operation from t1 (tPROG#00).

In t2 to t3, data input DIN#02 to the memory device_02 may be performed. The memory device_02 may receive a program command, an addresses, and data through the channel 0 CH0 while the data input DIN#02 is performed. Since the memory device_00, the memory device_01, the memory device_02, and the memory device_03 are commonly connected to the channel 0 CH0, the memory device_00, the memory device_01, and the memory device_03 which are the remaining memory devices might not use the channel 0 CH0 while the data input DIN#02 to the memory device_02 is performed. However, since the memory device_00 receives the data in the period t0 to t1 (DIN#00), the memory device_00 may perform the program operation from t1. (tPROG#00). In addition, since the memory device_01 receives the data in a period t1 to t2 (DIN#01), the memory device_01 may perform the program operation from t2 (tPROG#01).

In t3 to t4, data input DIN#03 to the memory device_03 may be performed. The memory device_03 may receive a program command, an addresses, and data through the channel 0 CH0 while the data input DIN#03 is performed. Since the memory device_00, the memory device_01, the memory device_02, and the memory device_03 are commonly connected to the channel 0 CH0, the memory device_00, the memory device_01, the memory device_02 which are the remaining memory devices might not use the channel 0 CH0 while the data input DIN#03 to the memory device_03 is performed. However, since the memory device_00 receives the data in the period t0 to t1 (DIN#00), the memory device_00 may perform the program operation from t1 (tPROG#00). In addition, since the memory device_01 receives the data in the period t1 to t2 (DIN#01), the memory device_01 may perform the program operation from t2 (tPROG#01). In addition, since the memory device_02 receives the data in a period t2 to t3 (DIN#02), the memory device_02 may perform the program operation from t3 (tPROG#02).

At t4, the program operation of the memory device_00 may be completed (tPROG#00).

Thereafter, in t4 to t8, the data input DIN#00, DIN#01, DIN#02, and DIN#03 to the memory device_00 to memory device_03 may be performed in a method identical to that performed in t0 to t4.

Referring to FIGS. 10 to 12, when the operation according to the first program operation 1st PGM and the second program operation 2nd PGM is performed according to the data input method according to the embodiments of FIG. 10, a bottleneck phenomenon between the memory controller and the memory devices may occur due to the first program operation 1st PGM with a relatively short data input period.

However, in a case where this is performed according to the program order determined through FIGS. 8, 9A, and 9B, when the CSB and MSB data of an N-th page and the LSB page of an (N+1)-th page are combined, complete page data is input. Therefore, when the first program operation 1st PGM and the second program operation 2nd PGM are performed by the interleaving method, data storage efficiency may be faster.

In various embodiments, the memory device may independently use voltages used in the first program operation and voltages used in the second program operation.

Hereinafter, a method of controlling the voltages used in the first program operation and the second program operation in detail is described with reference to FIGS. 13 to 18.

Figure 13:
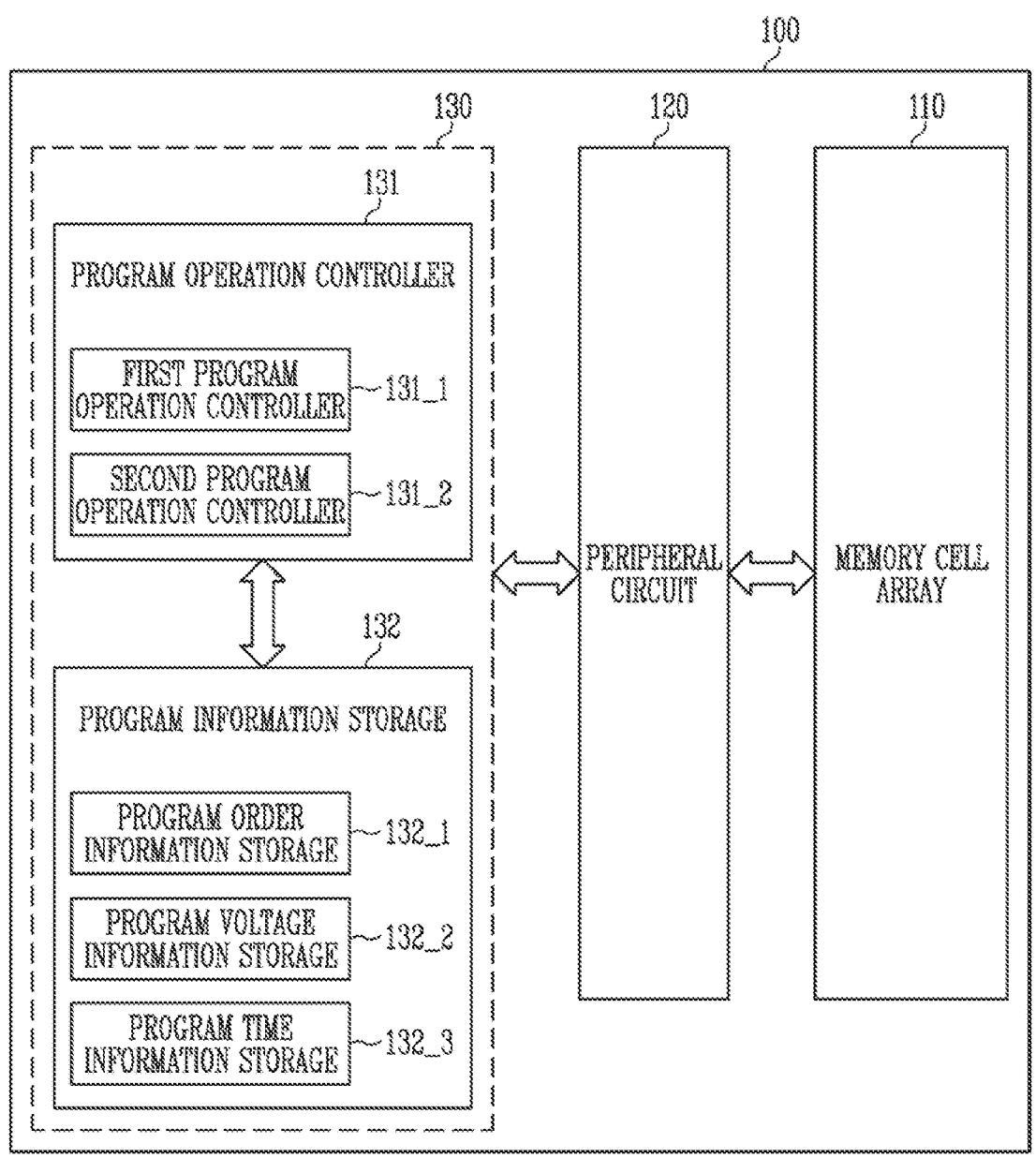
FIG. 13 is a diagram illustrating a configuration of a memory device that performs a program operation of the present disclosure.

FIG. 13 is a diagram illustrating a configuration of a memory device that performs a program operation of the present disclosure.

Referring to FIG. 13, the memory device 100 may include a memory cell array 110, a peripheral circuit 120, and a control logic 130.

The memory cell array 110 and the peripheral circuit 120 may be configured and operated identically to the memory cell array 110 and the peripheral circuit 120 described with reference to FIG. 2.

The control logic 130 may include a program operation controller 131 and a program information storage 132. The program operation controller 131 may control the program operation of the memory device 100. The program operation controller 131 may include a first program operation controller 131_1 that controls a first program operation and a second program operation controller 131_2 that controls a second program operation.

The program information storage 132 may store various pieces of information used for the program operation. The program information storage 132 may include a program order information storage 132_1, a program voltage information storage 132_2, and a program time information storage 132_3.

The program order information storage 132_1 may store the program order information described with reference to FIGS. 9A and 9B. The program order information may be stored in advance in a contents addressable memory (CAM) block, which is one of the plurality of memory blocks included in the memory cell array 110, and then may be loaded in the program order information storage 132_1 when the memory device 100 is booted. The program operation controller 131 may control the peripheral circuit 120 to perform the first program operation and the second program operation according to the program order information stored in the program order information storage 132_1.

The program voltage information storage 132_2 may store information on voltages used in the program operation. In an embodiment, the information on the voltages used in the program operation may include offset voltage information, second program operation start voltage information, step voltage information, and pass voltage information.

A voltage applied to the selected word line during the first program operation may be a fixed program voltage having a voltage of a predetermined magnitude. In various embodiments, the voltage applied to the selected word line during the first program operation may be a voltage obtained by adding a predetermined offset voltage to a program start voltage applied during the second program operation. In an embodiment, the voltage applied to the selected word line during the first program operation may be a voltage obtained by adding a predetermined offset voltage having a different magnitude according to a position of the selected word line to the program start voltage applied during the second program operation.

During the first program operation, a first pass voltage may be applied to the unselected word lines. During the second program operation, a second pass voltage may be applied to the unselected word lines. In an embodiment, a magnitude of the first pass voltage may have a voltage magnitude different from that of the second pass voltage. For example, the magnitude of the first pass voltage may have a voltage level higher than that of the second pass voltage. Alternatively, the magnitude of the first pass voltage may have a voltage level lower than that of the second pass voltage.

When performing the first program operation and the second program operation, the memory device may apply a pass voltage having a voltage level different from the pass voltage applied to the unselected word lines adjacent to the selected word line to the remaining unselected word lines. At this time, magnitudes of the pass voltage applied during the first program operation and the pass voltage applied during the second program operation may be different.

The program time information storage 132_3 may store information on application times of the voltages applied during the program operation.

Figure 14:
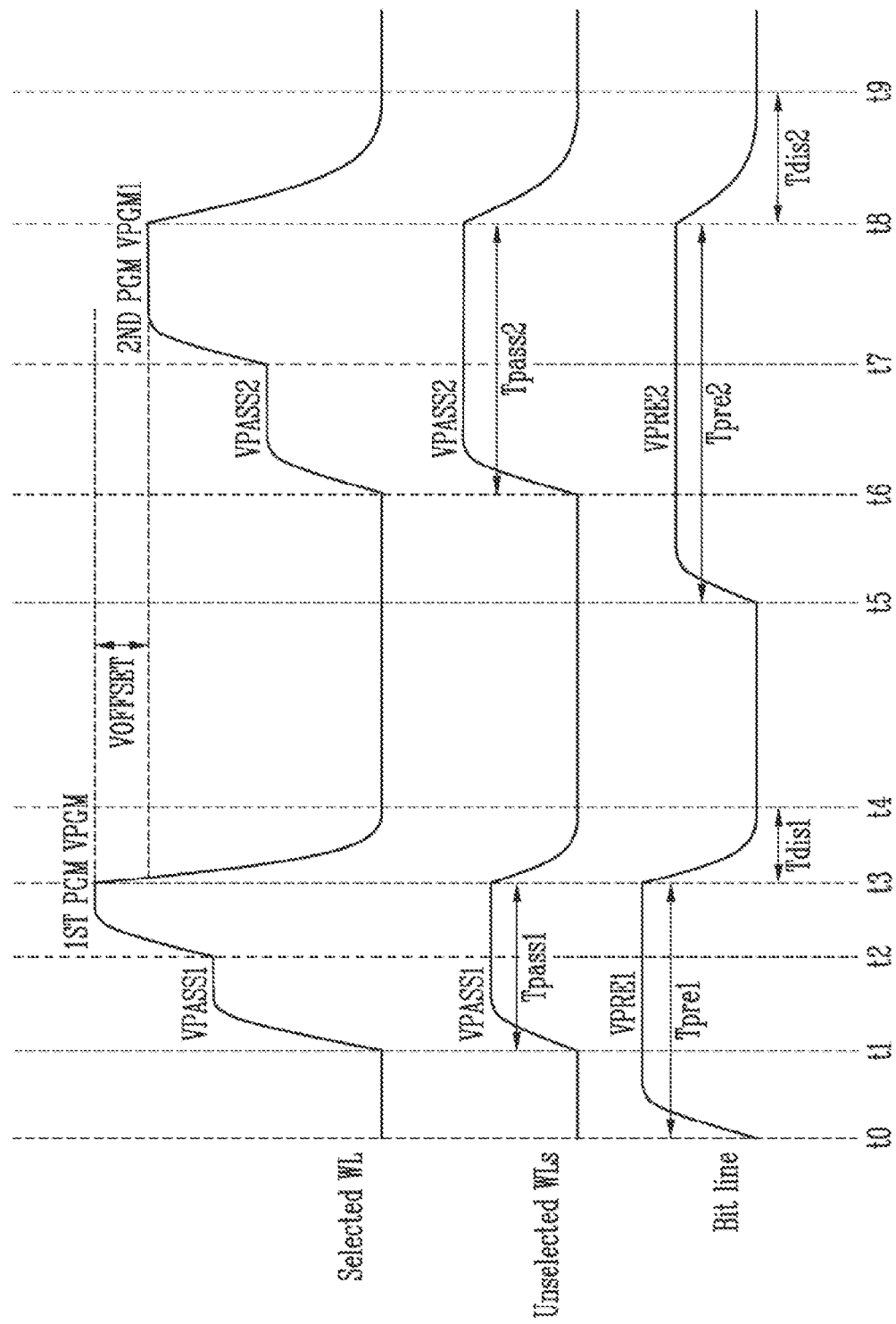
FIG. 14 is a diagram illustrating voltages applied during a first program operation and a second program operation.

FIG. 14 is a diagram illustrating voltages applied during a first program operation and a second program operation.

Referring to FIG. 14, during t0 to t4, the memory device may perform the first program operation, and during t5 to t9, the memory device may perform a program voltage apply step of a first program loop of the second program operation.

At t0, a first precharge voltage VPRE1 may be applied to bit lines to which memory cells of which program is to be inhibited are connected among the bit lines to which the memory cells are connected. The first precharge voltage VPRE1 may be applied during t0 to t3, this period may be a first precharge period Tpre1.

At t1, a first pass voltage VPASS1 may be applied to selected word line Selected WL and unselected word lines Unselected WLs. The first pass voltage VPASS1 may be applied during t1 to t3, this period may be a first pass voltage period Tpass1.

During t2 to t3, a first program voltage 1ST PGM VPGM may be applied to the selected word line Selected WL. A magnitude of the first program voltage 1ST PGM VPGM may be a voltage of a level higher than a second program voltage 2ND PGM VPGM1, which is a program voltage applied in the first program loop of the second program operation, by an offset voltage VOFFSET.

During t3 to t4, voltages applied to a bit line Bit Line, the selected word line Selected the WL, and the unselected word lines Unselected WLs may be discharged. This period may be a first discharge period Tdis1.

At t5, a second precharge voltage VPRE2 may be applied to the bit lines to which the memory cells of which the program is to be inhibited are connected among the bit lines to which the memory cells are connected. The second precharge voltage VPRE2 may be applied during t5 to t8, and this period may be a second precharge period Tpre2.

In an embodiment, the second precharge voltage VPRE2 may be a voltage having a voltage level different from that of the first precharge voltage VPRE1. For example, the second precharge voltage VPRE2 may be a voltage lower than the first precharge voltage VPRE1. However, in the embodiment of FIG. 14, a magnitude of the second precharge voltage VPRE2 is not limited. In various embodiments, the magnitude of the second precharge voltage VPRE2 may be higher than that of the first precharge voltage VPRE1.

A length of the second precharge period Tpre2 in which the second precharge voltage VPRE2 is applied in the second program operation may have a length different from a length of the first precharge period Tpre1 in which the first precharge voltage VPRE1 is applied in the first program operation. For example, the length of the second precharge period Tpre2 may be a time longer than the length of the first precharge period Tpre1. However, the length of the second precharge period Tpre2 is not limited according to the embodiment of FIG. 14, and the length of the second precharge period Tpre2 may be a time shorter than the length of the first precharge period Tpre1.

At t6, a second pass voltage VPASS2 may be applied to the selected word line Selected WL and the unselected word lines Unselected WLs. The second pass voltage VPASS2 may be applied during t6 to t8, and this period may be a second pass voltage period Tpass2.

In an embodiment, the second pass voltage VPASS2 may be a voltage having a voltage level different from that of the first pass voltage VPASS1. For example, the second pass voltage VPASS2 may be a voltage higher than the first pass voltage VPASS1. However, in the embodiment of FIG. 14, a magnitude of the second pass voltage VPASS2 is not limited. In various embodiments, the magnitude of the second pass voltage VPASS2 may be lower than the first pass voltage VPASS1.

A length of the second pass voltage period Tpass2 in which the second pass voltage VPASS2 is applied in the second program operation may have a length different from a length of the first pass voltage period Tpass1 in which the first pass voltage VPASS1 is applied in the first program operation. For example, the length of the second pass voltage period Tpass2 may be a time longer than the length of the first pass voltage period Tpass1. However, the length of the second pass voltage period Tpass2 is not limited according to the embodiment of FIG. 14, and the length of the second pass voltage period Tpass2 may be a time shorter than the length of the first pass voltage period Tpass1.

During t7 to t8, a second program voltage 2ND PGM VPGM1, which is a program voltage applied in the first program loop of the second program operation, may be applied to the selected word line WL. A magnitude of the second program voltage 2ND PGM VPGM1 may be a voltage of a level lower than that of the first program voltage 1ST PGM VPGM by the offset voltage VOFFSET.

During t8 to t9, the voltages applied to the bit line Bit Line, the selected word line Selected WL, and the unselected word lines Unselected WLs may be discharged. This period may be a second discharge period Tdis2.

A length of the second discharge period Tdis2 in which the voltages of each line are discharged in the second program operation may have a length different from a length of the first discharge period Tdis1 in which the voltages of each line are discharged in the first program operation. For example, the length of the second discharge period Tdis2 may be a time longer than the length of the first discharge period Tdis1. However, the length of the second discharge period Tdis2 is not limited according to the embodiment of FIG. 14, and the length of the second discharge period Tdis2 may be a time shorter than the length of the first discharge period Tdis1.

FIG. 15 is a diagram illustrating an embodiment of the program voltage information storage of FIG. 13.

Referring to FIG. 15, the program voltage information storage 132_2 may include offset voltage information OFFSET VOLTAGE, second program operation start voltage information 2ND PGM START VOLTAGE, step voltage information STEP VOLTAGE, and pass voltage information 1ST PASS VOLTAGE and 2ND PASS VOLTAGE.

The offset voltage information OFFSET VOLTAGE may include information VOFFSET on a magnitude of the offset voltage used to determine the program voltage applied to the selected word line during the first program operation. For example, the program voltage applied to the selected word line during the first program operation may be a voltage obtained by adding the offset voltage to the program start voltage applied during the second program operation.

The second program start voltage information 2ND PGM START VOLTAGE may include information VPGM_START on a magnitude of the program voltage applied in the first program loop of the second program operation.

The step voltage information STEP VOLTAGE may include information VSTEP on a magnitude of the step voltage that is increased for each program loop in the second program operation.

The pass voltage information 1ST PASS VOLTAGE and 2ND PASS VOLTAGE may include first pass voltage information 1ST PASS VOLTAGE and second pass voltage information 2ND PASS VOLTAGE.

The first pass voltage information 1ST PASS VOLTAGE may include information VPASS1 on a magnitude of the pass voltage applied to the unselected word lines during the first program operation. The second pass voltage information 2ND PASS VOLTAGE may include information VPASS2 on the magnitude of the pass voltage applied to the unselected word lines during the second program operation. The second pass voltage may be a voltage having a voltage level different from that of the first pass voltage. For example, the second pass voltage may be higher than the first pass voltage. Alternatively, the magnitude of the second pass voltage may be lower than the first pass voltage.

FIG. 16 is a diagram illustrating another embodiment of the program voltage information storage of FIG. 13.

The program voltage information storage 132_2' of FIG. 16 may include offset voltage information OFFSET VOLTAGE for applying different offset voltages according to the selected word line.

The plurality of memory cells connected to the memory block may have different electrical characteristics according to a position of the connected word line. Therefore, in order to determine an optimum program operation voltage, an optimum offset voltage may be determined according to the position of each word line through a test process when the memory device is manufactured.

Referring to FIG. 16, each of the offset voltages of word line 00 WL00 to word line 16 WL16 may have different voltage values as offset voltage 00 VOFFSET00 to offset voltage 16 VOFFSET16. In an embodiment, word lines included in the memory block may be divided into a plurality of groups, and different offset voltages may be used for each group.

An operation of a more optimized first program voltage may be performed using the program voltage information as in the embodiment of FIG. 16.

FIG. 17 is a diagram illustrating another embodiment of the program voltage information storage of FIG. 13.

The program voltage information storage 132_2" of FIG. 17 may include pass voltage information 1ST PASS VOLTAGE(N+1, N−1), 1ST PASS VOLTAGE(OTHER), 2ND PASS VOLTAGE(N+1, N−1), and 2ND PASS VOLTAGE (OTHER).

Referring to FIG. 17, the pass voltage information 1ST PASS VOLTAGE(N+1, N−1), 1ST PASS VOLTAGE(OTHER), 2ND PASS VOLTAGE(N+1, N−1), and 2ND PASS VOLTAGE(OTHER) may include information 1ST PASS VOLTAGE(N+1, N−1) on the pass voltage applied to adjacent unselected word lines during the first program operation, information 1ST PASS VOLTAGE(OTHER) on the pass voltage applied to the remaining unselected word lines during the first program operation, information 2ND PASS VOLTAGE(N+1, N−1) on the pass voltage applied to adjacent unselected word lines during the second program operation, and information 2ND PASS VOLTAGE(OTHER) on the pass voltage applied to the remaining unselected word lines during the second program operation.

Assuming that the selected word line is an N-th word line, (N+1)-th and (N−1)-th word lines adjacent to the N-th word line may be unselected word lines adjacent to the selected word line. Among the unselected word lines, the remaining word lines excluding the adjacent unselected word lines may be the remaining unselected word lines (OTHER).

The pass voltages of different magnitudes may be applied to the adjacent unselected word lines and the remaining unselected word lines, respectively. In various embodiments, the pass voltages of different magnitudes may also be applied to the adjacent unselected word lines and the remaining unselected word lines in the first program operation and the second program operation, respectively.

For example, during the first program operation, a third pass voltage VPASS3 may be applied to the adjacent unselected word lines, and a fourth pass voltage VPASS4 may be applied to the remaining unselected word lines. During the second program operation, a fifth pass voltage VPASS5 may be applied to the adjacent unselected word lines, and a sixth pass voltage VPASS6 may be applied to the remaining unselected word lines.

Figures 18, 19:
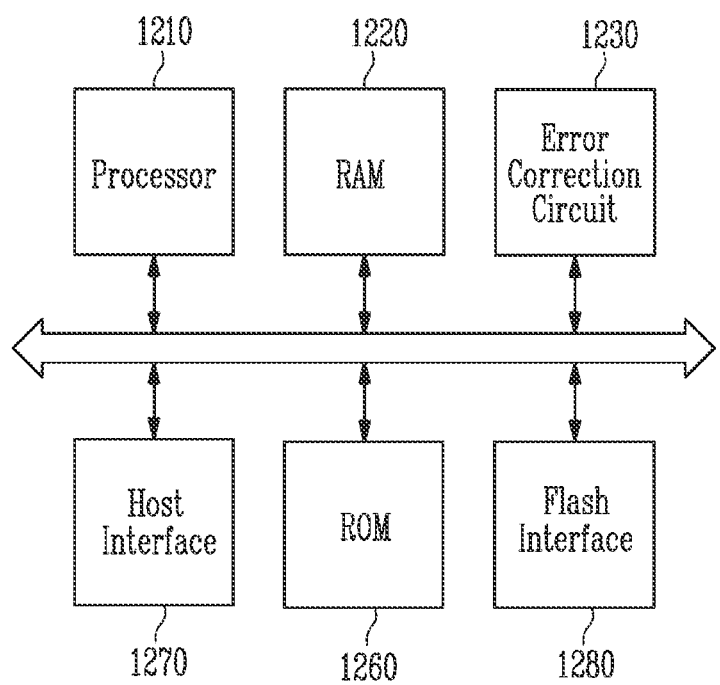
FIG. 18 is a diagram illustrating an embodiment of a program time information storage of FIG. 13.
FIG. 19 is a diagram illustrating another embodiment of the memory controller of FIG. 1.

FIG. 18 is a diagram illustrating an embodiment of the program time information storage of FIG. 13.

Referring to FIG. 18, the program time information storage 132_3 may include information on lengths of a precharge period PRECHARGE TIME indicating a period in which the precharge voltage is applied during a first program operation 1ST PROGRAM and a second program operation 2ND PROGRAM, a pass voltage period PASS VOLTAGE APPLICATION TIME in which the pass voltage is applied, and a discharge period DISCHARGE TIME in which voltages of each of lines are discharged.

As described with reference to FIG. 14, the precharge period PRECHARGE TIME in the first program operation 1ST PROGRAM may be the first precharge period Tpre1, the pass voltage period PASS VOLTAGE APPLICATION TIME may be the first pass voltage period Tpass1, and the discharge period DISCHARGE TIME may be the first discharge period Tdis1.

In addition, the precharge period PRECHARGE TIME in the second program operation 2ND PROGRAM may be the second precharge period Tpre2, the pass voltage period PASS VOLTAGE APPLICATION TIME may be the second pass voltage period Tpass2, and the discharge period DISCHARGE TIME may be the second discharge period Tdis2.

The lengths of the precharge period PRECHARGE TIME, the pass voltage period PASS VOLTAGE APPLICATION TIME, and the discharge period DISCHARGE TIME may have different lengths during the first program operation 1ST PROGRAM and the second program operation 2ND PROGRAM. The memory device may efficiently control a performance time of the entire program operation in a case where lengths of a time in which the voltage is applied or discharged are differently applied during the first program operation 1ST PROGRAM and the second program operation 2ND PROGRAM.

FIG. 19 is a diagram illustrating another embodiment of the memory controller of FIG. 1.

Referring to FIGS. 1 and 19, the memory controller 1200 may include a processor 1210, a RAM 1220, an error correction circuit 1230, a ROM 1260, a host interface 1270, and a flash interface 1280.

The processor 1210 may control overall operations of the memory controller 1200. The RAM 1220 may be used as a buffer memory, a cache memory, an operation memory, and the like of the memory controller 1200.

The ROM 1260 may store various information required for the memory controller 1200 to operate in a firmware form.

The memory controller 1200 may communicate with an external device (for example, the host 300 described with reference to FIG. 1, an application processor, and the like) through the host interface 1270.

The memory controller 1200 may communicate with the memory device 100 described with reference to FIG. 1 through the flash interface 1280. The memory controller 1200 may transmit a command CMD, an address ADDR, a control signal CTRL, and the like to the memory device 100 and receive data DATA through the flash interface 1280. For example, the flash interface 1280 may include a NAND interface.

Figure 20:
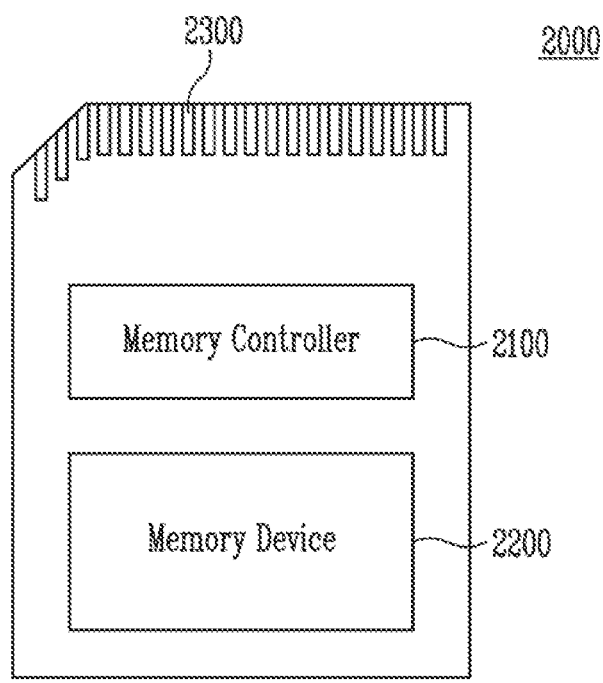
FIG. 20 is a block diagram illustrating a memory card system to which the storage device according to an embodiment of the present disclosure is applied.

FIG. 20 is a block diagram illustrating a memory card system to which the storage device according to an embodiment of the present disclosure is applied.

Referring to FIG. 20, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented equally to the memory controller 200 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 21:
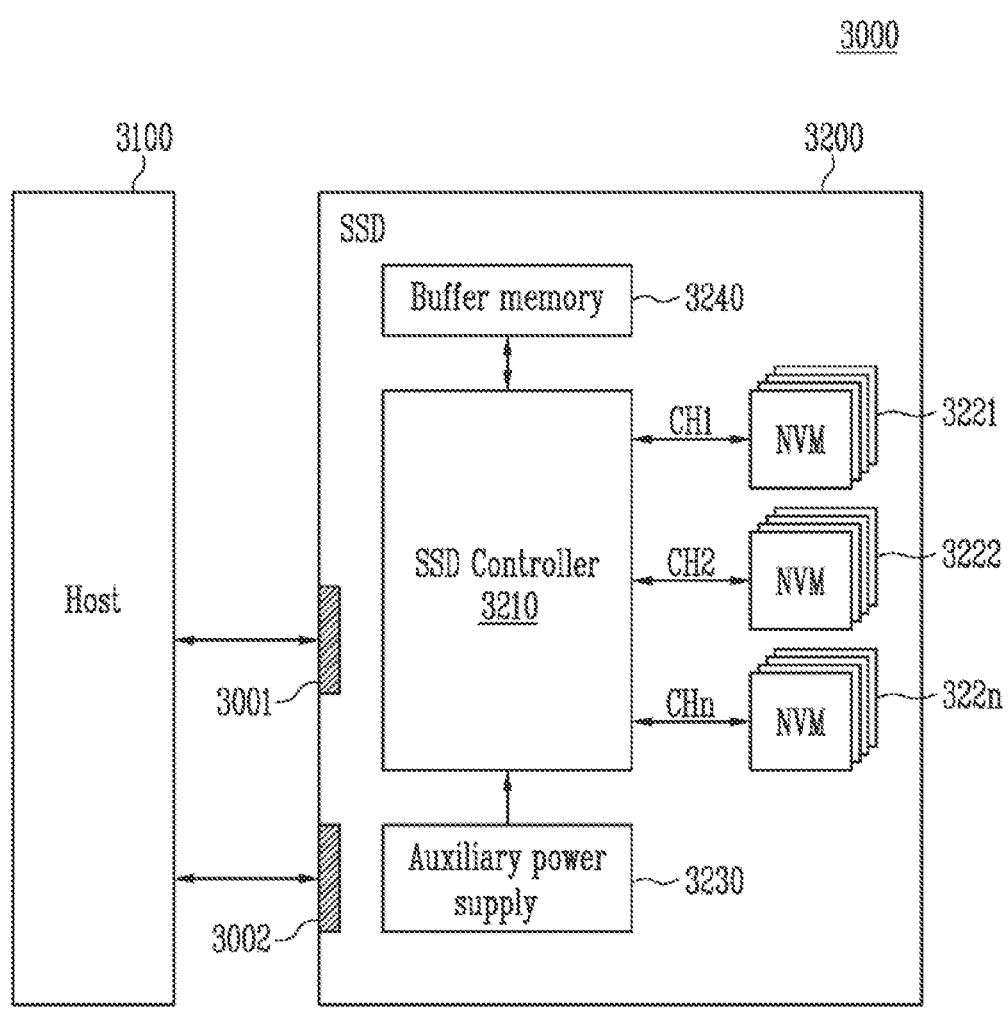
FIG. 21 is a block diagram illustrating a solid state drive (SSD) system to which the storage device according to an embodiment of the present disclosure is applied.

FIG. 21 is a block diagram illustrating a solid state drive (SSD) system to which the storage device according to an embodiment of the present disclosure is applied.

Referring to FIG. 21, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 22:
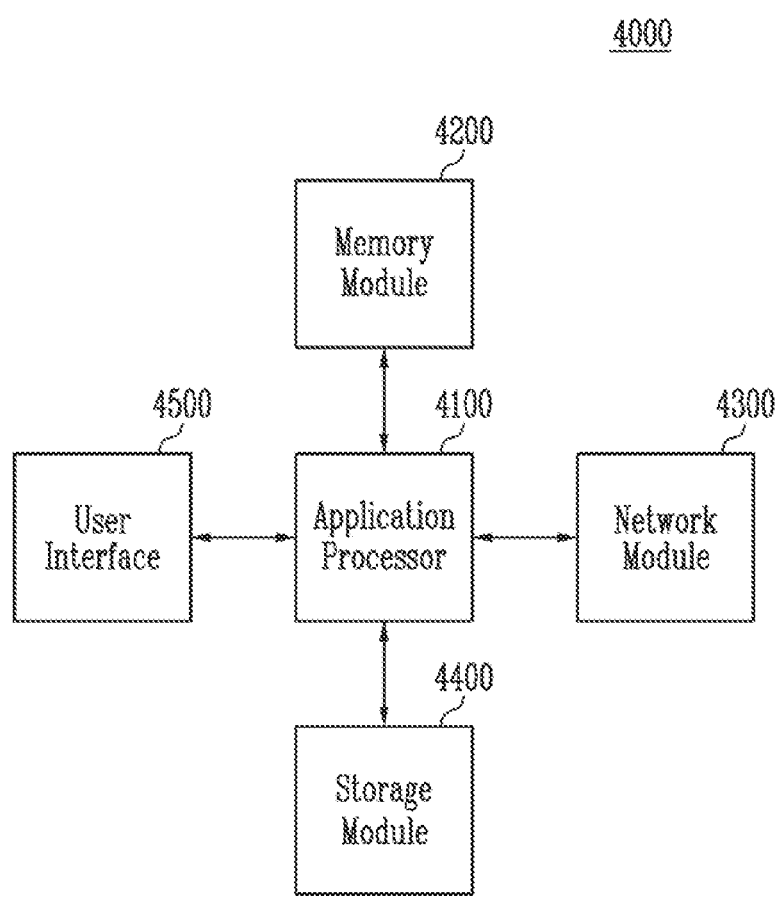
FIG. 22 is a block diagram illustrating a user system to which the storage device according to an embodiment of the present disclosure is applied.

FIG. 22 is a block diagram illustrating a user system to which the storage device according to an embodiment of the present disclosure is applied.

Referring to FIG. 22, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a memory block including a plurality of physical pages each of which includes a plurality of memory cells;
   a peripheral circuit configured to receive one logical page data among a plurality of logical page data from a memory controller, perform a first program operation to a selected physical page among the plurality of physical pages using the one logical page data, receive remaining logical page data except for the one logical page data among the plurality of logical page data from the memory controller after the first program operation, and a second program operation to the selected physical page using the remaining logical page data, wherein the first program operation and the second program operation are operations of storing data in select memory cells connected to a selected word line among the plurality of memory cells; and
   a program operation controller configured to control the first program operation and the second program operation,
   wherein the first program operation includes a program pulse apply step of applying a fixed program voltage having a predetermined voltage level to the selected word line only once, and excludes a verify step,
   wherein the second program operation includes a plurality of program loops each including a program voltage apply step of applying a program voltage to a word line to which the select memory cells are commonly connected and the verify step of verifying target program states of the select memory cells, and
   wherein the fixed program voltage has a level greater by an offset voltage than a voltage applied to the word line in a first program loop among the plurality of program loops.

2. The memory device of claim 1,
   wherein the first program operation is an operation of programming threshold voltages of the select memory cells to correspond to any one of an erase state or an intermediate state.

3. The memory device of claim 2,
   wherein a number of target program states of memory cells to be programmed to the erase state among the select memory cells and a number of target program states of memory cells to be programmed to the intermediate state are the same.

4. The memory device of claim 1, wherein the select memory cells have any one of an erase state and first to n-th program states (n is a natural number equal to or greater than 2) as a target program state.

5. The memory device of claim 4, wherein the peripheral circuit performs a read operation of reading the data stored in the select memory cells.

6. The memory device of claim 5, further comprising: control logic configured to control the read operation.

7. The memory device of claim 6,
wherein the data includes the plurality of logical page data, and
wherein the control logic controls the peripheral circuit to read using one read voltage when reading any one of the plurality of logical page data.

8. The memory device of claim 1, wherein the one logical page data corresponds to least significant bit (LSB) page data.

9. The memory device of claim 8, wherein the remaining logical page data corresponds to at least one of central significant bit (CSB) page data and most significant bit (MSB) page data.

10. The memory device of claim 1, wherein the offset voltage has different voltage levels according to a position of the word line.

11. The memory device of claim 1, wherein magnitudes of a pass voltage applied to unselected word lines among the plurality of memory cells during the first program operation and a pass voltage applied to the unselected word lines among the plurality of memory cells during the second program operation have different voltage levels.

12. The memory device of claim 11, wherein the program operation controller applies pass voltages having different voltage levels to unselected word lines adjacent to the selected word line among the unselected word lines, and remaining unselected word lines.

13. The memory device of claim 1, wherein the program operation controller differently controls a time when the fixed program voltage is applied in the first program operation and a time when the program voltage is applied in the second program operation.

14. A storage device comprising:
memory devices; and
a memory controller configured to provide program commands instructing to store data in the memory devices,
wherein each of the memory devices comprises:
a memory cell block including a plurality of physical pages each of which includes a plurality of memory cells;
a peripheral circuit configured to receive one logical page data among a plurality of logical page data from the memory controller, perform a first program operation to a selected physical page among the plurality of physical pages using the one logical page data, receive remaining logical page data except for the one logical page data among the plurality of logical page data from the memory controller after the first program operation, and a second program operation to the selected physical page using the remaining logical page data, wherein the first program operation and the second program operation are operations of storing the data in select memory cells which are memory cells selected from among the plurality of memory cells, in response to the program commands; and
a program operation controller configured to control the first program operation and the second program operation,
wherein the first program operation includes a program pulse apply step of applying a fixed program voltage to a word line to which the select memory cells are commonly connected only once, and excludes a verify step,
wherein the second program operation includes a plurality of program loops each including a program voltage apply step of applying a program voltage to the word line and the verify step of verifying target program states of the select memory cells, and
wherein the fixed program voltage has a level greater by an offset voltage than a voltage applied to the word line in a first program loop among the plurality of program loops.

15. The storage device of claim 14, wherein the first program operation is an operation of programming threshold voltages of the select memory cells to correspond to any one of an erase state or an intermediate state.

16. The storage device of claim 15, wherein a number of target program states of memory cells to be programmed to the erase state among the select memory cells and a number of target program states of memory cells to be programmed to the intermediate state are the same.

17. The storage device of claim 14, wherein the second program operation includes a plurality of program loops each including a program voltage apply step of applying a program voltage to the word line and the verify step of verifying target program states of the select memory cells.

18. The storage device of claim 17,
wherein magnitudes of a pass voltage applied to unselected word lines among the plurality of memory cells during the first program operation and a pass voltage applied to the unselected word lines among the plurality of memory cells during the second program operation have different voltage levels.

19. The storage device of claim 18,
wherein the program operation controller applies pass voltages having different voltage levels to unselected word lines adjacent to the word line among the unselected word lines, and remaining unselected word lines.

20. The storage device of claim 17,
wherein the program operation controller differently controls a time when the fixed program voltage is applied in the first program operation and a time when the program voltage is applied in the second program operation.

21. The storage device of claim 14, wherein the offset voltage has different voltage levels according to a position of the word line.

* * * * *